US010720445B1

(12) United States Patent
Shimizu et al.

(10) Patent No.: US 10,720,445 B1
(45) Date of Patent: Jul. 21, 2020

(54) THREE-DIMENSIONAL MEMORY DEVICE HAVING NITRIDED DIRECT SOURCE STRAP CONTACTS AND METHOD OF MAKING THEREOF

(71) Applicant: SANDISK TECHNOLOGIES LLC, Addison, TX (US)

(72) Inventors: Satoshi Shimizu, Yokkaichi (JP); Takumi Moriyama, Yokkaichi (JP); Kiyohiko Sakakibara, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/146,156

(22) Filed: Sep. 28, 2018

Related U.S. Application Data

(60) Provisional application No. 62/627,906, filed on Feb. 8, 2018.

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 23/5226* (2013.01); *H01L 23/53295* (2013.01);
(Continued)

(58) Field of Classification Search
CPC .......... H01L 27/11582; H01L 27/1157; H01L 27/11565; H01L 27/11556;
(Continued)

(56) References Cited

U.S. PATENT DOCUMENTS 5,915,167 A 6/1999 Leedy
9,799,670 B2 10/2017 Nishikawa et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Allen L Parker
*Assistant Examiner* — Gustavo G Ramallo
(74) *Attorney, Agent, or Firm* — The Marbury Law Group PLLC

(57) ABSTRACT

A lower source-level semiconductor layer, a sacrificial semiconductor layer, an upper source-level semiconductor layer, and an alternating stack of insulating layers and sacrificial material layers are sequentially formed over a substrate. An array of memory stack structures containing vertical semiconductor channels that extend through the alternating stack and into an upper portion of the lower source-level semiconductor layer is formed. A backside trench is formed through the alternating stack, and a source cavity is formed by removing the sacrificial semiconductor layer. A doped source contact layer is formed on each of the vertical semiconductor channels in the source cavity. A silicon nitride liner is formed on the doped source contact layer. The sacrificial material layers are replaced with electrically conductive layers. A dielectric wall structure is formed in the backside trench.

11 Claims, 37 Drawing Sheets

(51) Int. Cl.
  *H01L 27/11573* (2017.01)
  *H01L 27/11565* (2017.01)
  *H01L 29/423* (2006.01)
  *H01L 23/522* (2006.01)
  *H01L 23/532* (2006.01)
  *H01L 27/11526* (2017.01)
  *H01L 27/11519* (2017.01)
  *H01L 27/11524* (2017.01)
  *H01L 27/11556* (2017.01)

(52) U.S. Cl.
  CPC .... *H01L 27/1157* (2013.01); *H01L 27/11565* (2013.01); *H01L 27/11573* (2013.01); *H01L 29/4234* (2013.01); *H01L 27/11519* (2013.01); *H01L 27/11524* (2013.01); *H01L 27/11526* (2013.01); *H01L 27/11556* (2013.01)

(58) Field of Classification Search
  CPC ......... H01L 27/11519; H01L 27/11526; H01L 27/11524; H01L 23/53295; H01L 23/3226
  See application file for complete search history.

(56) References Cited

U.S. PATENT DOCUMENTS

| | | | |
|---|---|---|---|
| 9,824,966 B1 | 11/2017 | Kanakamedala et al. | |
| 9,831,266 B2 | 11/2017 | Kai et al. | |
| 9,917,100 B2 | 3/2018 | Zhang et al. | |
| 9,985,098 B2 | 5/2018 | Matsumoto et al. | |
| 10,008,570 B2 | 6/2018 | Yu et al. | |
| 10,020,363 B2 | 7/2018 | Ogawa et al. | |
| 2006/0292802 A1* | 12/2006 | Lee | H01L 21/336 438/264 |
| 2017/0148800 A1 | 5/2017 | Nishikawa et al. | |
| 2017/0148810 A1 | 5/2017 | Kai et al. | |
| 2017/0148811 A1 | 5/2017 | Zhang et al. | |
| 2018/0122904 A1 | 5/2018 | Matsumoto et al. | |
| 2018/0122905 A1 | 5/2018 | Ogawa et al. | |
| 2018/0122906 A1* | 5/2018 | Yu | H01L 29/1037 257/296 |

OTHER PUBLICATIONS

U.S. Appl. No. 15/626,444, filed Jun. 19, 2017, SanDisk Technologies LLC.
U.S. Appl. No. 15/633,131, filed Jun. 26, 2017, SanDisk Technologies LLC.
U.S. Appl. No. 15/997,194, filed Jun. 4, 2018, SanDisk Technologies LLC.
U.S. Appl. No. 16/023,035, filed Jun. 29, 2018, SanDisk Technologies LLC.

* cited by examiner

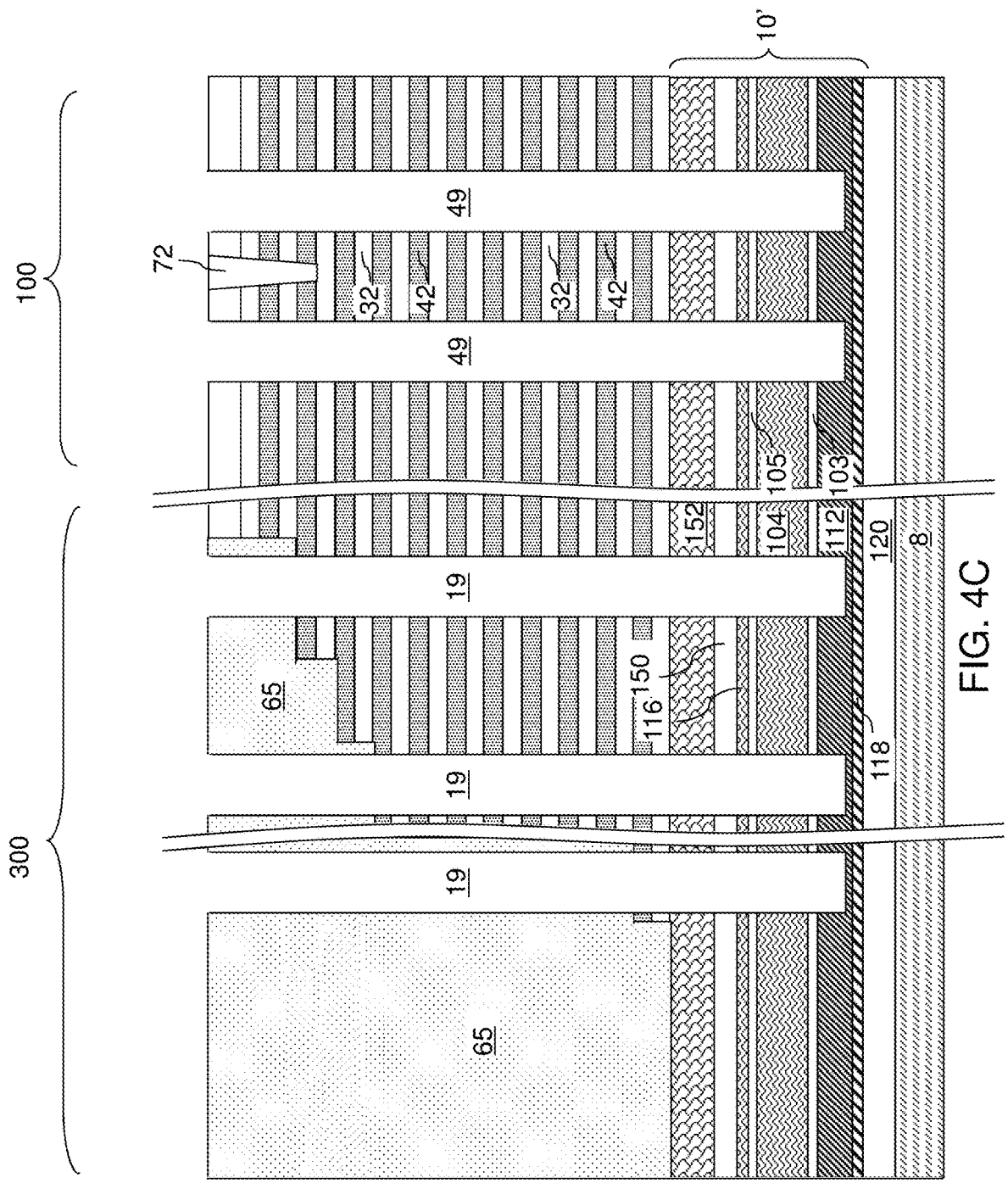

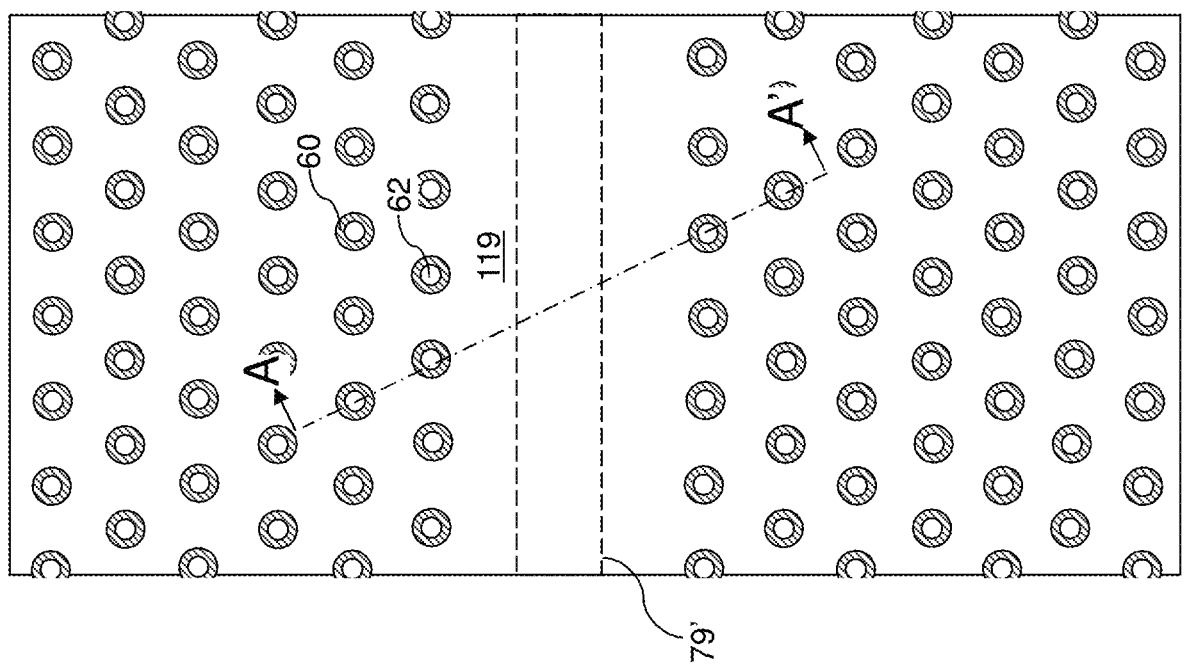

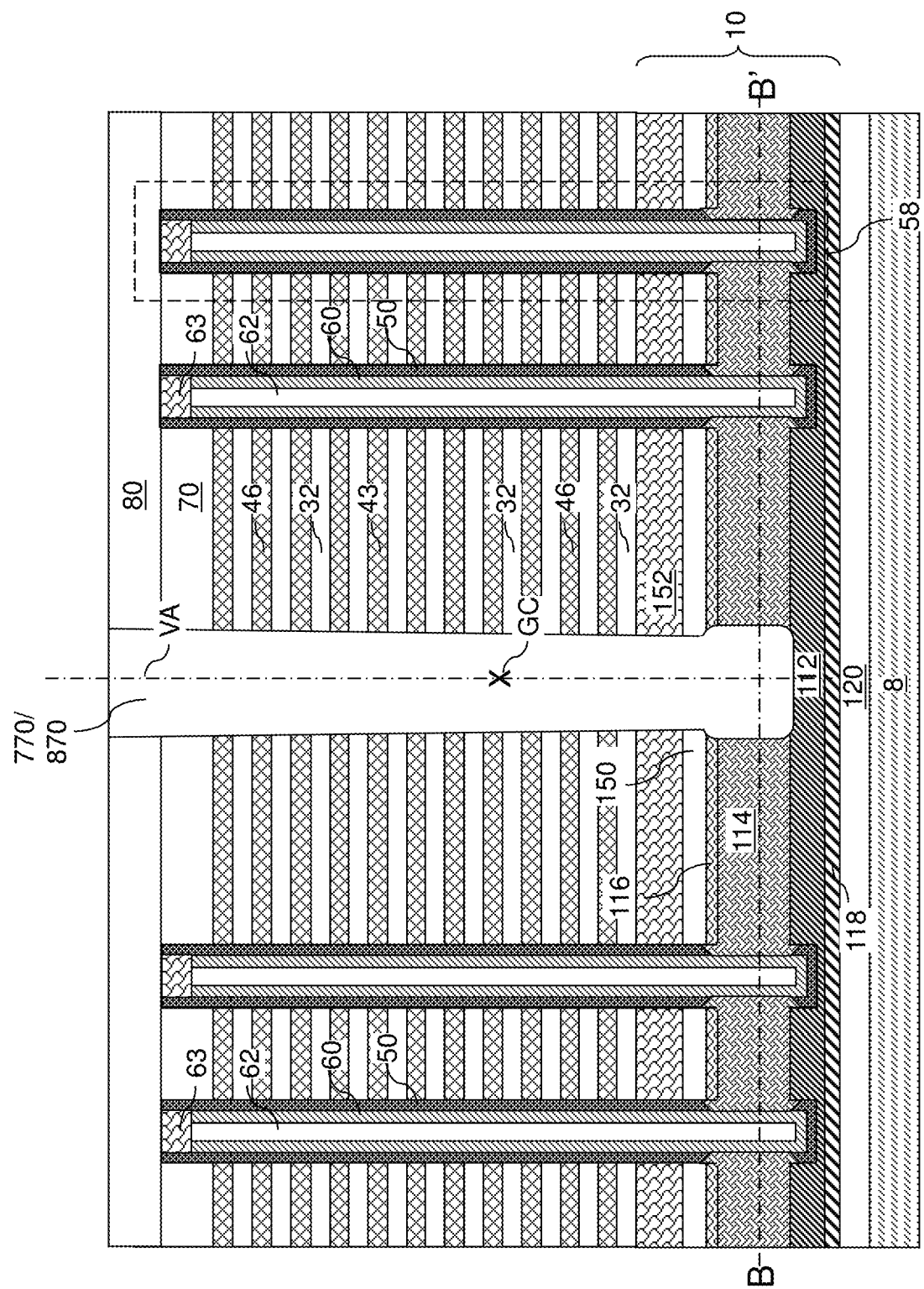

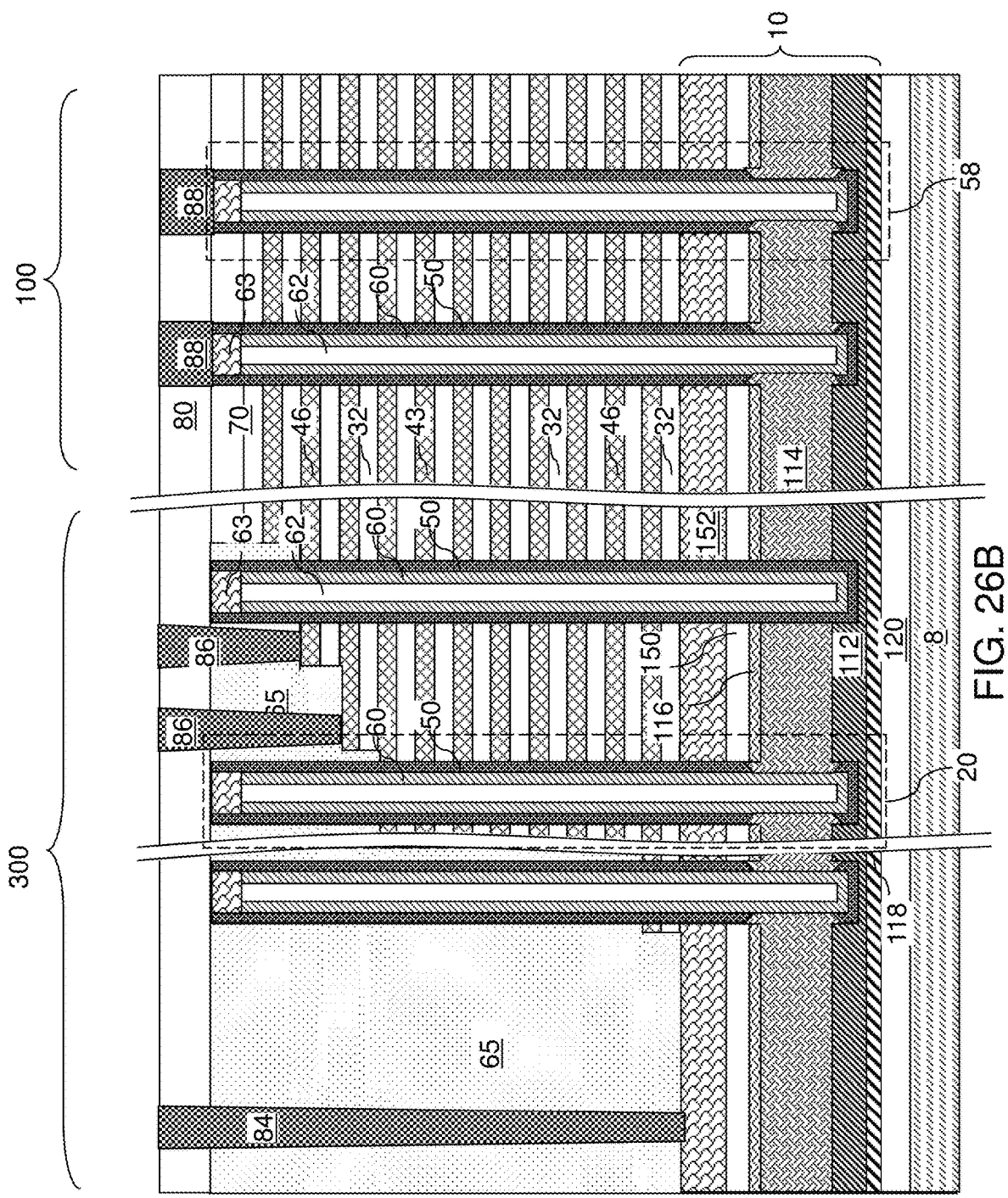

THREE-DIMENSIONAL MEMORY DEVICE HAVING NITRIDED DIRECT SOURCE STRAP CONTACTS AND METHOD OF MAKING THEREOF

FIELD

The present disclosure relates generally to the field of semiconductor devices and specifically to a three-dimensional memory structure employing nitrided direct source strap contacts to vertical semiconductor channels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: source-level material layers located over a substrate and including a lower source-level semiconductor layer comprising a first semiconductor material, an upper source-level semiconductor layer comprising a second semiconductor material, and a doped source contact layer comprising a third doped semiconductor material and contacting the lower source-level semiconductor layer and the upper source-level semiconductor layer; an alternating stack of electrically conductive layers and insulating layers located over the source-level material layers; an array of memory stack structures that extend through the alternating stack and at least down to the doped source contact layer, each memory stack structure including a vertical semiconductor channel and a memory film laterally surrounding the vertical semiconductor channel, wherein the doped source contact layer contacts an outer sidewall of each of the vertical semiconductor channels; a dielectric wall structure vertically extending through each layer within the alternating stack and extending below an interface between the doped source contact layer and the upper source-level semiconductor layer; and a silicon nitride liner located between the doped source contact layer and the dielectric wall structure.

According to another aspect of the present disclosure, a method of forming a three-dimensional memory device is provided, which comprises: forming in-process source-level layers comprising a lower source-level semiconductor layer comprising a first semiconductor material, a sacrificial semiconductor layer; and an upper source-level semiconductor layer comprising a second semiconductor material; forming an alternating stack of insulating layers and spacer material layers over the upper source-level semiconductor layer, wherein the spacer material layers are formed as, or are subsequently replaced with, electrically conductive layers; forming an array of memory stack structures that extend through the alternating stack and at least into the sacrificial semiconductor layer, each memory stack structure including a vertical semiconductor channel and a memory film laterally surrounding the vertical semiconductor channel; replacing the sacrificial semiconductor layer with a doped source contact layer and a silicon nitride liner, wherein the doped source contact layer is formed directly on an outer sidewall of each of the vertical semiconductor channels, and wherein the silicon nitride liner is formed on the doped source contact layer; and forming a dielectric wall structure extending through the alternating stack over the silicon nitride liner.

BRIEF DESCRIPTION OF THE DRAWINGS

FIG. 4C is another vertical cross-sectional view of the first exemplary structure of FIGS. 4A and 4B along a direction that straddles the memory array region and the contact region.

FIG. 9B is a horizontal cross-sectional view of the first exemplary structure along the horizontal plane B-B' of the FIG. 9A. The vertical cross-sectional plane A-A' is the vertical cross-sectional plane of FIG. 9A.

FIG. 25A is a vertical cross-sectional view of the first or second exemplary structure after the processing steps of FIGS. 16A, 16B, or FIG. 24 according to embodiments of the present disclosure.

FIG. 26B is another vertical cross-sectional view of the first or second exemplary structure after formation of contact via structures according to embodiments of the present disclosure.

DETAILED DESCRIPTION

Figure 1:
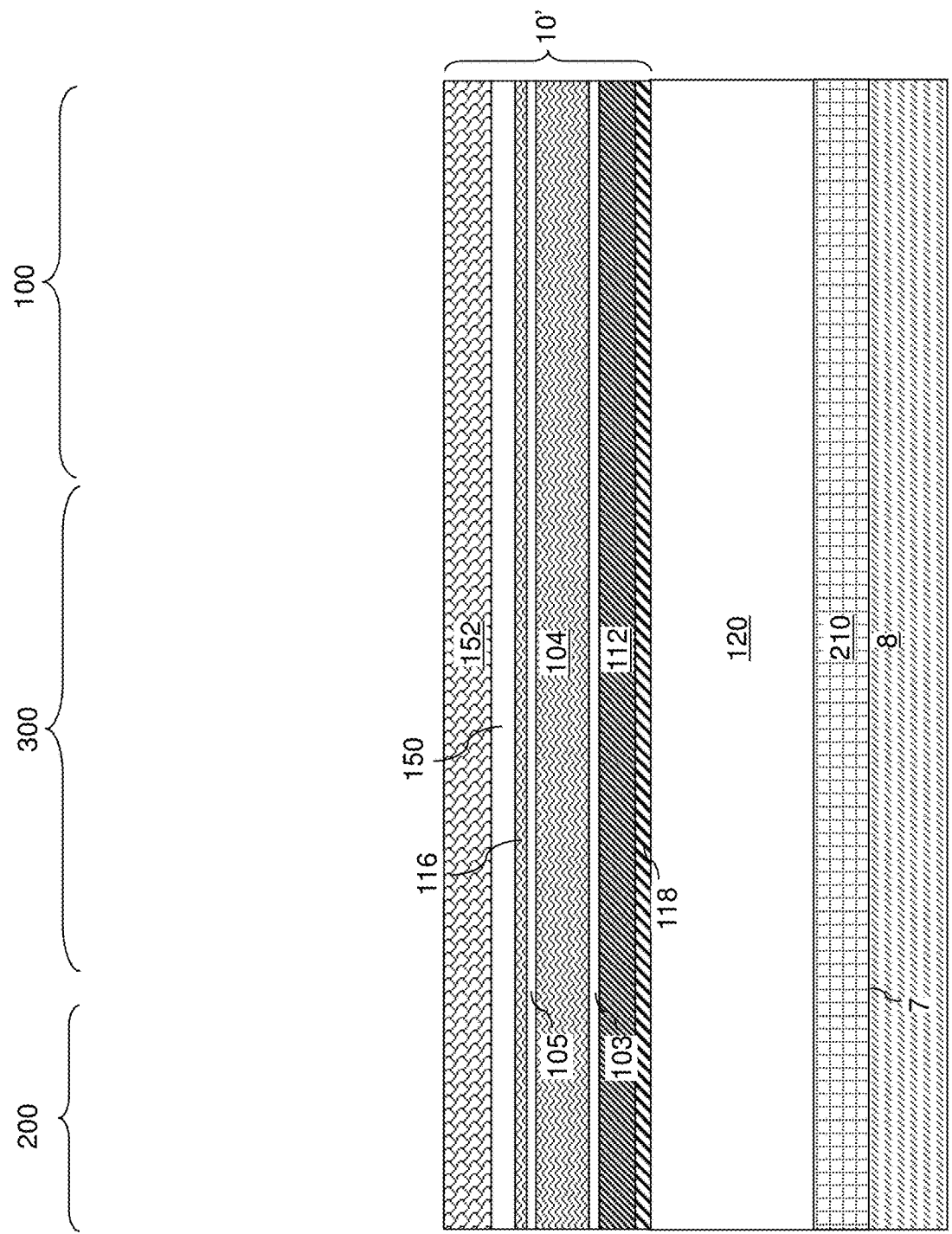
FIG. 1 is a vertical cross-sectional view of a first exemplary structure after formation of an optional metallic source layer, a lower source-level semiconductor layer, a optional lower sacrificial etch stop layer, a sacrificial semiconductor layer, an optional upper sacrificial etch stop layer, an upper source-level semiconductor layer, a source-level dielectric layer, and a source-select-gate semiconductor layer according to a first embodiment of the present disclosure.

As discussed above, the present disclosure is directed to a three-dimensional memory structure employing nitrided direct source strap contacts to vertical semiconductor channels and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated. The first exemplary structure includes a substrate 8, which can be a semiconductor substrate such as a silicon substrate. The substrate 8 can include a substrate semiconductor layer. The substrate semiconductor layer maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate 8 can have a major surface 7, which can be, for example, a topmost surface of the substrate semiconductor layer. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, semiconductor devices 210 can be optionally formed on the substrate 8. The semiconductor devices 210 can include, for example, field effect transistors including respective source regions, drain regions, channel regions, and gate structures. Shallow trench isolation structures (not expressly shown) can be formed in an upper portion of the semiconductor substrate 8 to provide electrical isolation among the semiconductor devices. The semiconductor devices 210 can include any semiconductor circuitry to support operation of a memory structure to be subsequently formed, which is typically referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer can be optionally formed over the semiconductor devices 210 and/or the substrate 8, which is herein referred to as at least one lower level dielectric layer 120. The at least one lower level dielectric layer 120 functions as a matrix for lower level metal interconnect structures (not explicitly shown) that provide electrical wiring among the various nodes of the semiconductor devices 210 and landing pads for through-memory-level via structures to be subsequently formed. The lower level metal interconnect structures can include various device contact via structures, lower level metal lines, lower level via structures, and lower level topmost metal structures that are configured to function as landing pads for through-memory-level via structures to be subsequently formed.

The first exemplary structure can include a memory array region 100, a contact region 300, and an optional peripheral device region 200. An array of memory stack structures can be subsequently formed in the memory array region 100 and over the at least one lower level dielectric layer 120 (if present). Contacts to word lines of the memory stack structures can be subsequently formed in the contact region 300. If present, additional semiconductor devices and/or through-memory-level via structures can be formed in the peripheral device region 200. The semiconductor devices 210 may be present in any, and/or each, of the areas of the memory array region 100, the contact region 300, and the peripheral device region 200. For example, the semiconductor devices 210 may be present in the peripheral device region 200 but not under the memory array region 100 or the contact region 300. The region of the semiconductor devices 210 and the combination of the at least one lower level dielectric layer 120 and the lower level metal interconnect structures embedded therein is herein referred to an underlying peripheral device region, which may be located underneath a memory-level assembly to be subsequently formed and includes peripheral devices for the memory-level assembly. The semiconductor devices 210 and the at least one lower level dielectric layer 120 are optional, and thus, may be omitted.

In-process source-level material layers 10' can be formed over the at least one lower level dielectric layer 120 and/or the substrate 8. The in-process source-level material layers 10' can include, from bottom to top, an optional metallic source layer 108, a lower source-level semiconductor layer 112, an optional lower sacrificial etch stop layer 103, a sacrificial semiconductor layer 104, an optional upper sacrificial etch stop layer 105, an upper source-level semiconductor layer 116, an optional source-level dielectric layer 150, and an optional source-select-gate semiconductor layer 152.

The optional metallic source layer 108 includes a metallic material such as an elemental metal (such as tungsten), an intermetallic alloy of at least two elemental metals, a conductive metal nitride (such as TiN), or a metal silicide (such as cobalt silicide, nickel silicide, or tungsten silicide). The optional metallic source layer 108 provides a highly conductive horizontal current path for source electrodes to be subsequently formed. The optional metallic source layer 108 can be formed by a conformal deposition method or a non-conformal deposition method, and can have a thickness in a range from 20 nm to 200 nm, although lesser and greater thicknesses can also be employed.

The lower source-level semiconductor layer 112 includes a first semiconductor material. The dopant concentration of the lower source-level semiconductor layer 112 can be in a range from $1.0 \times 10^{19}/\text{cm}^3$ to $2.0 \times 10^{21}/\text{cm}^3$, although lesser and greater dopant concentrations can also be employed. In one embodiment, the lower source-level semiconductor layer 112 can include n-doped polysilicon, n-doped amorphous silicon that is converted into n-doped polysilicon in a subsequent processing step (such as an anneal process), or any p-doped or n-doped polycrystalline semiconductor material or any p-doped or n-doped amorphous semiconductor material that can be subsequently converted into a polycrystalline semiconductor material. In one embodiment, the type of doping of the lower source-level semiconductor layer 112 can be the same as the type of charge carriers injected into channels of memory stack structures to be subsequently formed. For example, if electrons are injected into the channels of the memory stack structures to be subsequently formed, the lower source-level semiconductor layer 112 can be n-doped. Alternatively, if holes are injected into the channels of the memory stack structures to be subsequently formed, the lower source-level semiconductor layer 112 can be p-doped. The type of doping of the lower source-level semiconductor layer 112 is herein referred to as a first conductivity type. The lower source-level semiconductor layer 112 can be deposited by a conformal deposition method (such as chemical vapor deposition) or a non-conformal deposition method. The thickness of the lower source-level semiconductor layer 112 can be in a range from 30 nm to 600 nm, although lesser and greater thicknesses can also be employed.

The optional lower sacrificial etch stop layer 103 includes an etch stop material, which can be a silicon oxide-based dielectric material. The optional lower sacrificial etch stop layer 103 may include thermal oxide formed by thermal oxidation of a surface portion of the lower source-level semiconductor layer 112, or can include a deposited silicon oxide material that may be formed, for example, by thermal decomposition of a silicon oxide precursor gas (such as tetraethylorthosilicate gas). In one embodiment, the optional lower sacrificial etch stop layer 103 can include doped silicate glass or undoped silicate glass (i.e., silicon oxide). The optional lower sacrificial etch stop layer 103 can be deposited by a plasma enhanced chemical vapor deposition (PECVD) or low pressure chemical vapor deposition (LPCVD). The thickness of the optional lower sacrificial etch stop layer 103, as measured at horizontal portions, can be in a range from 10 nm to 50 nm, although lesser and greater thicknesses can also be employed.

The sacrificial semiconductor layer 104 is deposited over the lower source-level semiconductor layer 112. The sacrificial semiconductor layer 104 cab include a sacrificial semiconductor material that can be removed selective to the material of the optional lower sacrificial etch stop layer 103 by an etch process. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. For example, the sacrificial semiconductor layer 104 can include amorphous silicon, an amorphous silicon-germanium alloy, or a polycrystalline semiconductor material. The semiconductor material of the sacrificial semiconductor layer 104 may be intrinsic, p-doped, or n-doped. In one embodiment, the semiconductor material of the sacrificial semiconductor material layer 104 may be deposited without intentional doping with electrical dopants, and may be intrinsic or "lightly doped," i.e., have a doping at a dopant concentration less than $3.0 \times 10^{15}/\text{cm}^3$ caused by residual dopants incorporated during a deposition process that does not flow a dopant gas including p-type dopant atoms or n-type dopant atoms. The sacrificial semiconductor layer 104 can be deposited by chemical vapor deposition. The thickness of the sacrificial semiconductor layer 104 can be in a range from 20 nm to 200 nm, although lesser and greater thicknesses can also be employed.

The optional upper sacrificial etch stop layer 105 includes an etch stop material, which can be a silicon oxide-based dielectric material. The optional upper sacrificial etch stop layer 105 may include thermal oxide formed by thermal oxidation of a surface portion of the sacrificial semiconductor layer 104, or can include a deposited silicon oxide material that may be formed, for example, by thermal decomposition of a silicon oxide precursor gas (such as tetraethylorthosilicate gas). In one embodiment, the optional upper sacrificial etch stop layer 105 can include doped silicate glass or undoped silicate glass (i.e., silicon oxide). The optional upper sacrificial etch stop layer 105 can be deposited by a plasma enhanced chemical vapor deposition (PECVD) or low pressure chemical vapor deposition (LPCVD). The thickness of the optional upper sacrificial etch stop layer 105, as measured at horizontal portions, can be in a range from 10 nm to 50 nm, although lesser and greater thicknesses can also be employed. The material of the optional upper sacrificial etch stop layer 105 may be the same as, or may be different from, the material of the optional lower sacrificial etch stop layer 103.

The upper source-level semiconductor layer 116 includes a second semiconductor material, which can have a doping of the same conductivity type as the lower source-level semiconductor layer 112. The upper source-level semiconductor layer 116 can be formed on a top surface of the upper sacrificial etch stop layer 105. The second semiconductor material can be a material that can function as an etch stop material during subsequent etch of the optional upper sacrificial etch stop layer 105. For example, the upper source-level semiconductor layer 116 can include intrinsic (e.g., not intentionally doped) amorphous silicon, polysilicon, or a silicon-germanium alloy. Alternatively, the lower source-level semiconductor layer 112 and the upper source-level semiconductor layer 116 may be heavily doped with dopants a same conductivity type, which is the first conductivity type. The thickness of the upper source-level semiconductor layer 116 can be in a range from 10 nm to 100 nm, although lesser and greater thicknesses can also be employed.

The source-level dielectric layer 150 and the source-select-gate semiconductor layer 152 can be sequentially formed. The source-level dielectric layer 150 includes a dielectric material such as silicon oxide, a dielectric metal oxide, or a combination thereof. The thickness of the source-level dielectric layer 150 can be in a range from 3 nm to 10 nm, although lesser and greater thicknesses can also be employed. The source-select-gate semiconductor layer 152 includes a doped semiconductor material such as n-doped or p-doped amorphous silicon that can be converted into n-doped or p-doped polysilicon in an anneal process. The thickness of the source-select-gate semiconductor layer 152 can be in a range from 100 nm to 300 nm, although lesser and greater thicknesses can also be employed. The source-select-gate semiconductor layer 152 can be subsequently employed as an etch stop layer during formation of memory openings or backside trenches through an alternating stack of material layers to be subsequently formed.

Figure 2:
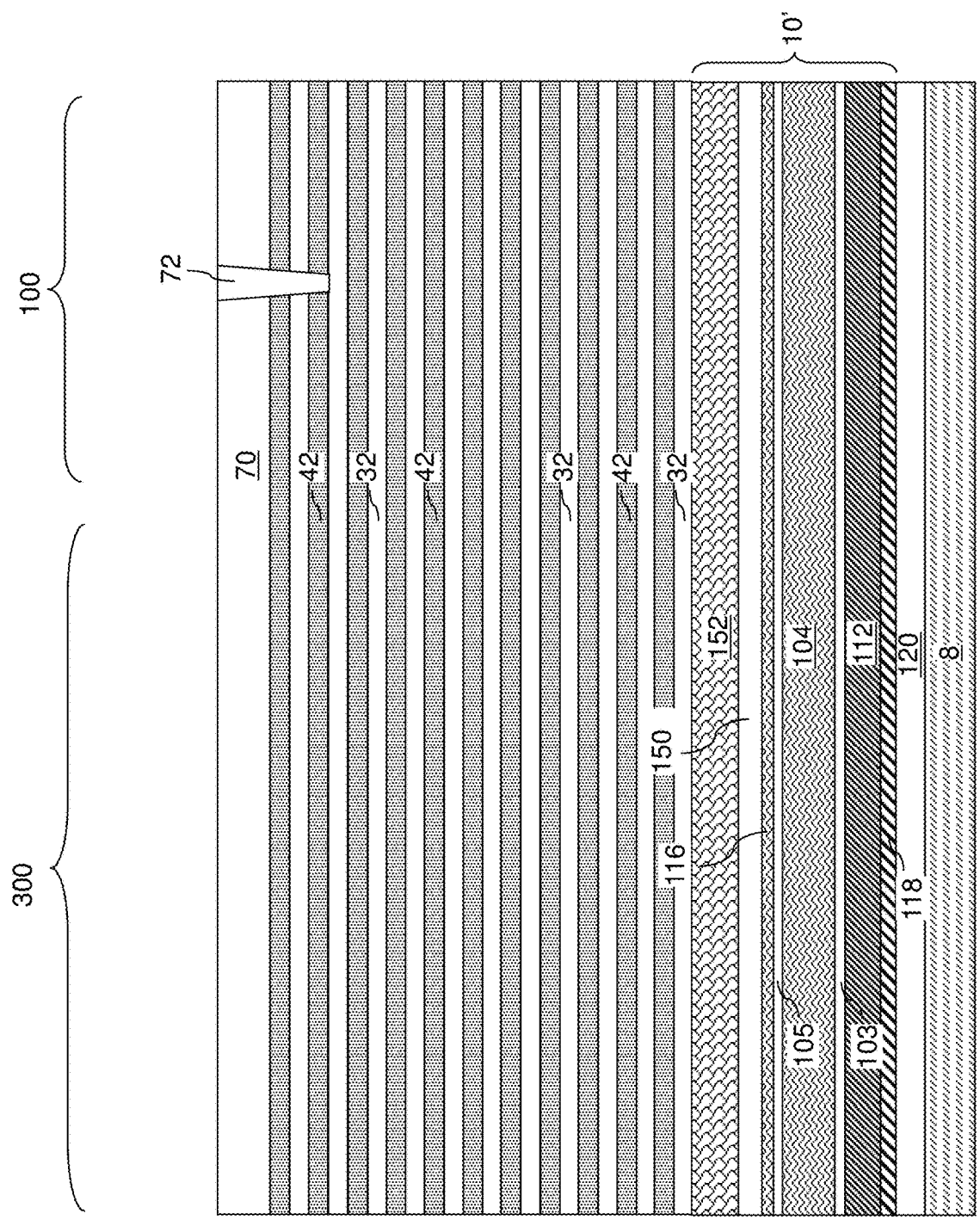
FIG. 2 is a vertical cross-sectional view of the first exemplary structure after formation of an alternating stack of insulating layers and sacrificial material layers and a dielectric cap layer according to the first embodiment of the present disclosure.

Referring to FIG. 2, a stack of an alternating plurality of first material layers (which can be insulating layers 32) and second material layers (which can be sacrificial material layer 42) is formed over the source-select-gate semiconductor layer 152. As used herein, a "material layer" refers to a layer including a material throughout the entirety thereof. Instances of the first material layers may have the same thickness thereamongst, or may have different thicknesses. Instances of the second elements may have the same thickness thereamongst, or may have different thicknesses. Each first material layer includes a first material, and each second material layer includes a second material that is different from the first material. In one embodiment, each first material layer can be an insulating layer 32, and each second material layer can be a spacer material layer. In one embodiment, each spacer material layer can be formed as a sacrificial material layer 42. In this case, an alternating stack (32, 42) of the insulating layers 32 and the sacrificial material layers 42 can be formed over the source-select-gate semiconductor layer 152. The levels of the layers in the alternating stack (32, 42) are collectively referred to as levels. The set of all structures formed in the levels is herein referred to as a structure.

Thus, the alternating stack (32, 42) can include the insulating layers 32 composed of the first material, and the sacrificial material layers 42 composed of a second material different from that of the insulating layers 32. The first material of the insulating layers 32 can be at least one insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

In one embodiment, the second material of the sacrificial material layers 42 is a sacrificial material that can be removed selective to the first material of the insulating layers 32. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and the sacrificial material layers 42 can include silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

Generally, the spacer material layers may be formed as, or may be subsequently replaced with, electrically conductive layers. While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

An insulating cap layer 70 can be deposited over the alternating stack (32, 42). The insulating cap layer 70 includes a material different from the material of the sacrificial material layers 42, and can include the same material as the insulating layers 32. For example, the insulating cap layer 70 can include silicon oxide. The thickness of the insulating cap layer 70 can be in a range from 30 nm to 500 nm, although lesser and greater thicknesses can also be employed.

Optionally, drain-select-level isolation structures 72 including a dielectric material different from the material of the sacrificial material layers 42 can be formed through at least one uppermost sacrificial material layer(s) 42. The drain-select-level isolation structures 72 are dielectric isolation structures that provide lateral electrical isolation among strips of electrically conductive layers to be subsequently formed at the drain select level, i.e., the level of the at least one sacrificial material layer 42 through which the drain-select-level isolation structures 72 extend.

While the present disclosure is described employing an embodiment in which the alternating stack (32, 42) is formed as an alternating stack of insulating layers 32 and sacrificial material layers 42, embodiments are expressly contemplated herein in which the alternating stack is formed as an alternating stack of insulating layers 32 and electrically conductive layers. In other words, the spacer material layers can be formed as electrically conductive layers. In this case, subsequent processing steps for replacing the sacrificial material layers 42 with electrically conductive layers can be omitted.

Figure 3:
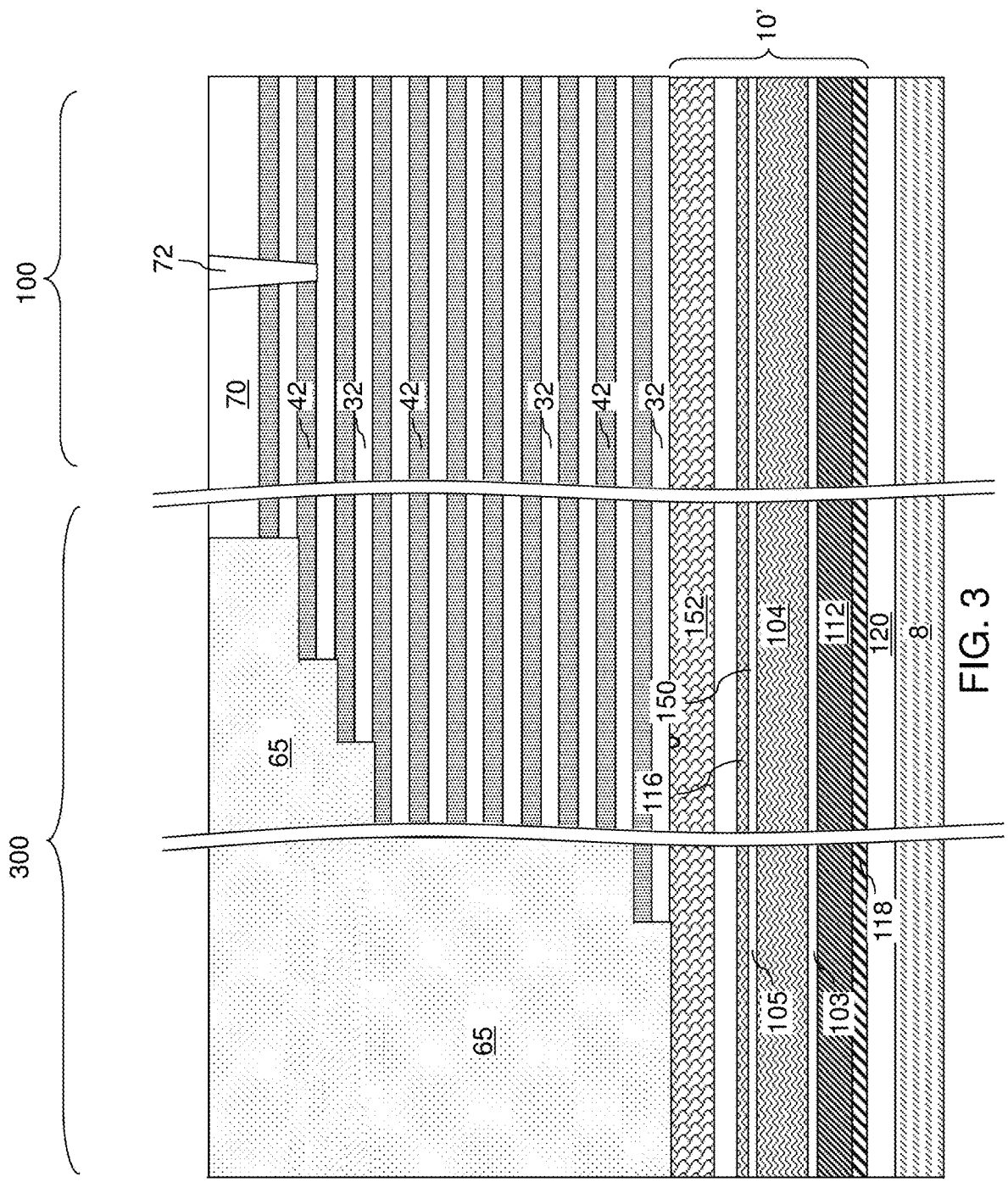
FIG. 3 is a vertical cross-sectional view of the first exemplary structure after formation of stepped surfaces and a retro-stepped dielectric material portion according to the first embodiment of the present disclosure.

Referring to FIG. 3, a stepped cavity can be formed within the contact region 300 which is located between the memory array region 100 (e.g., memory plane) and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
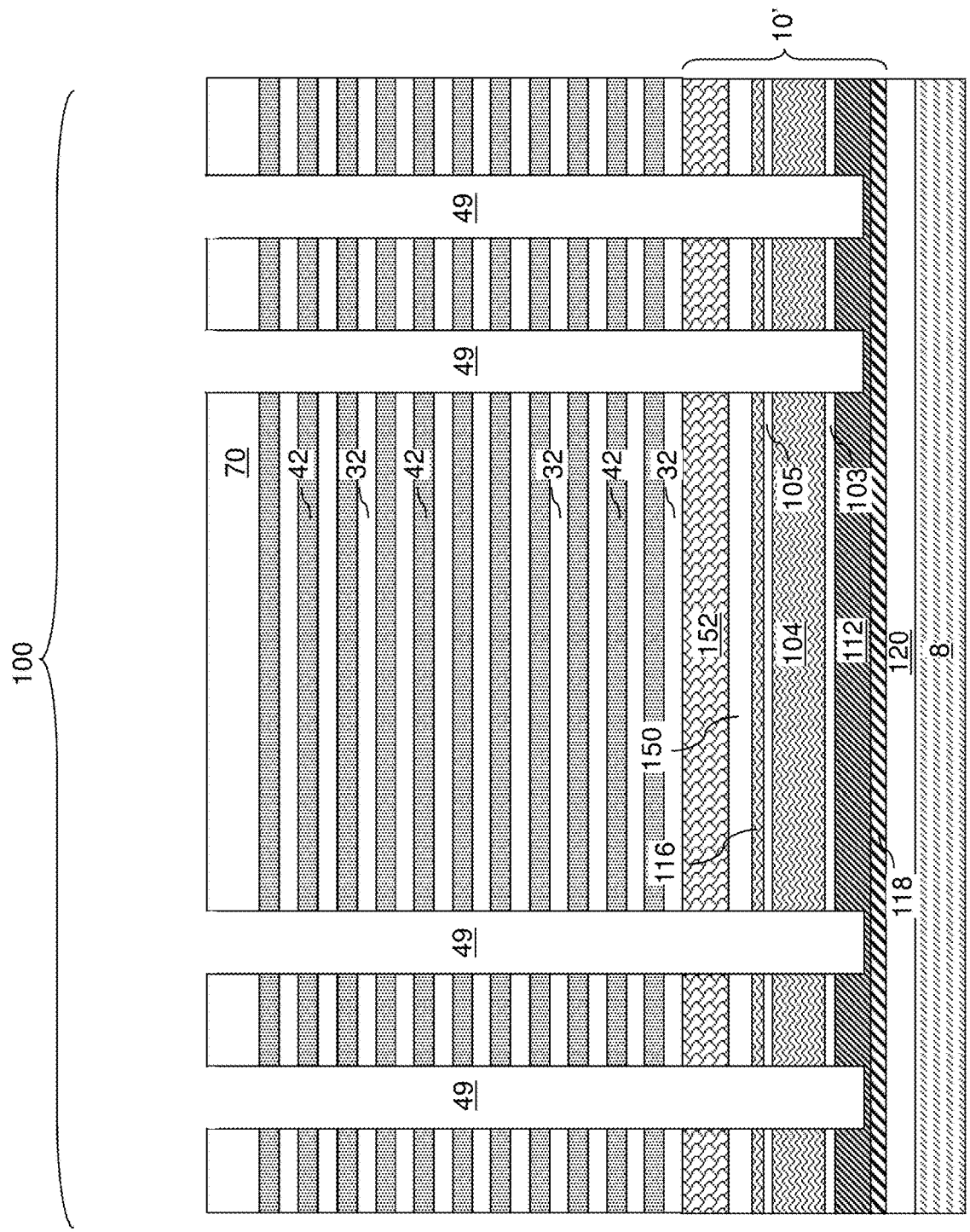
FIG. 4A is a vertical cross-sectional view of a memory array region of the first exemplary structure after formation of memory openings according to the first embodiment of the present disclosure.
Figure 4B:
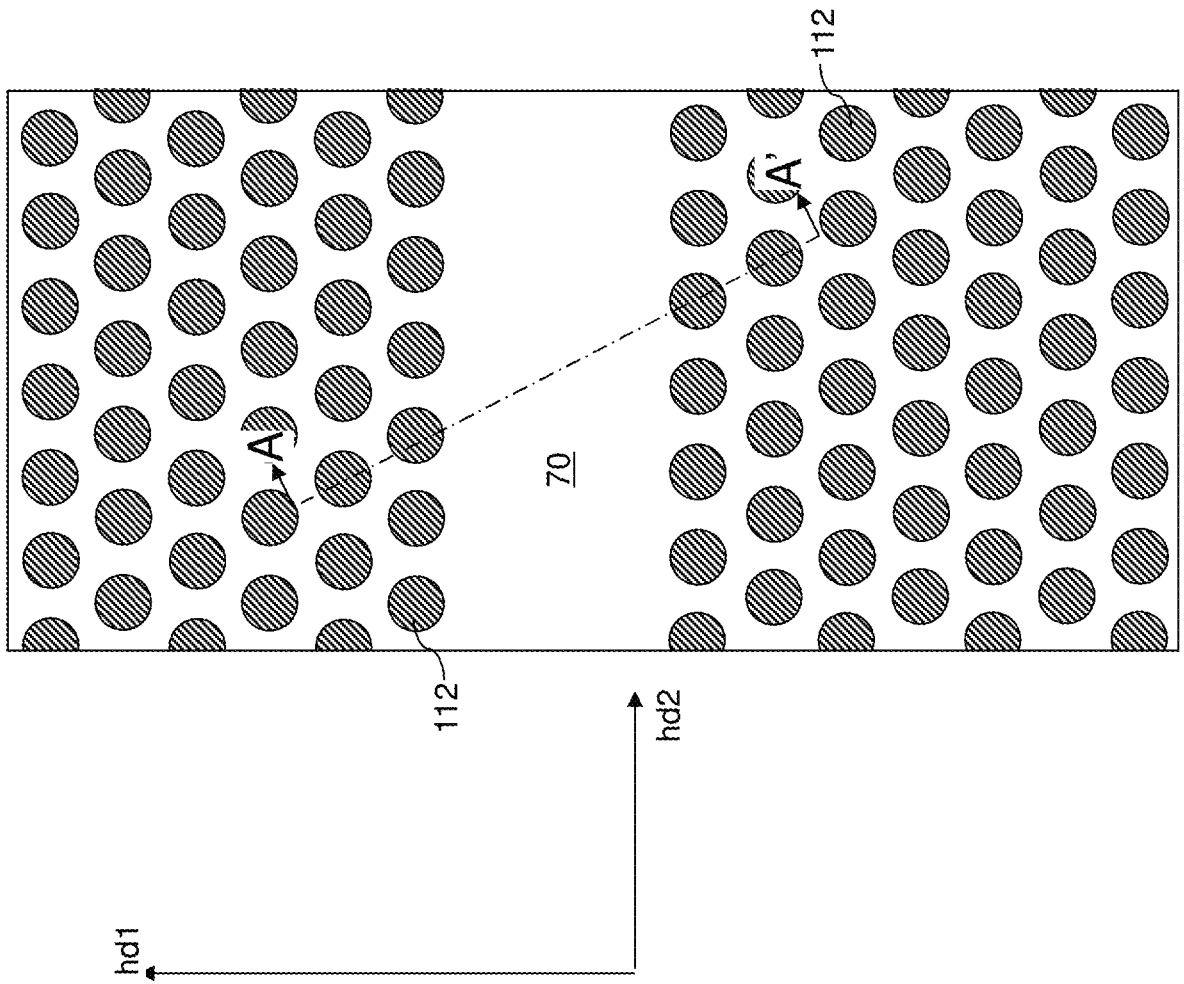
FIG. 4B is a top-down view of the first exemplary structure of FIG. 4A. The plane A-A' is the plane of the vertical cross-section of FIG. 4A.

Referring to FIGS. 4A-4C, a lithographic material stack (not shown) including at least a photoresist layer can be formed over the alternating stack (32, 42) and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the retro-stepped dielectric material portion 65 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42), the source-select-gate semiconductor layer 152, and the sacrificial semiconductor layer 104, and into an upper portion of the lower source-level semiconductor layer 112. The support openings 19 extend through the retro-stepped dielectric material portion 65, a subset of layers within the alternating stack (32, 42), the source-select-gate semiconductor layer 152, and the sacrificial semiconductor layer 104, and into an upper portion of the lower source-level semiconductor layer 112. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

Each of the memory openings 49 and the support openings 19 may have vertical sidewalls or tapered sidewalls. A two-dimensional array of memory openings 49 can be formed in the memory array region 100. A two-dimensional array of support openings 19 can be formed in the contact region 300.

Figure 5:
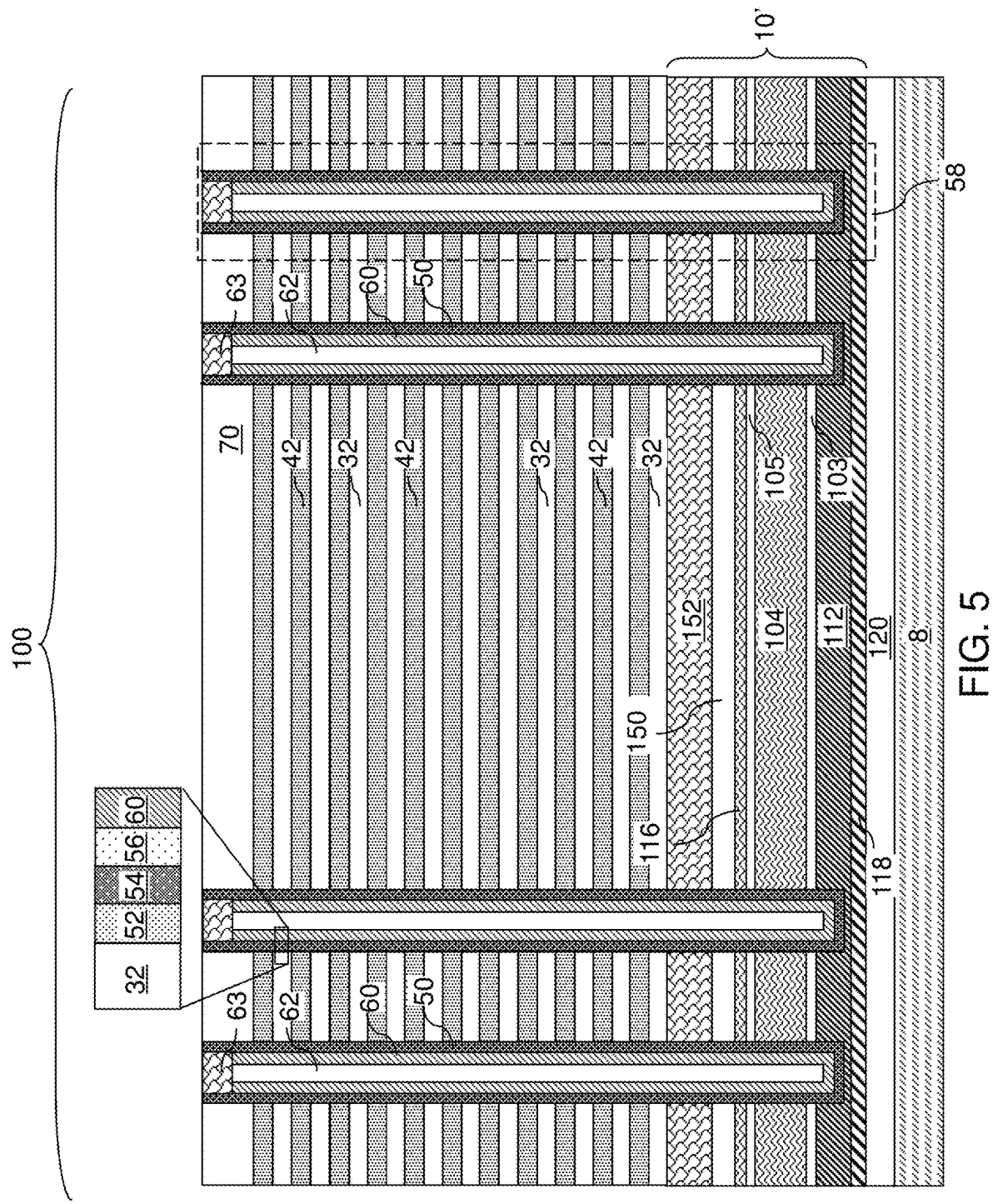
FIG. 5 is a vertical cross-sectional view of the first exemplary structure after formation of memory stack structures, dielectric cores, and drain regions according to the first embodiment of the present disclosure.

Referring to FIG. 5, each of the memory openings 49 and the support openings 19 is filled with a same set of material portions that is deposited by a same set of processing steps. Each set of material portions that fills a memory opening 49 is herein referred to as a memory opening fill structure 58. Each set of material portions that fills a support opening 19 is herein referred to as a support pillar structure, which has a pillar shape and provides structural support to the first exemplary structure during subsequent processing steps.

Specifically, a stack of layers including a blocking dielectric layer 52, a charge storage layer 54, a tunneling dielectric layer 56, and a semiconductor channel layer can be sequentially deposited in each of the memory openings 49 and the support openings 19. While FIG. 5 illustrates memory openings 49 and structures formed therein, it is understood that the same, or similar (in case the support openings 19 have different sizes than the memory openings 49) structures are formed in each of the support openings 19.

The blocking dielectric layer 52 can include a single dielectric material layer or a stack of a plurality of dielectric material layers. In one embodiment, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a upper sacrificial etch stop layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the blocking dielectric layer 52, the charge storage layer 54, and the tunneling dielectric layer 56 is herein referred to as a memory film 50.

The semiconductor channel layer includes a semiconductor material that is employed to form semiconductor channels 60. The semiconductor channel layer includes at least one semiconductor material that may include at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the semiconductor channel layer can be in a range from 2 nm to 10 nm, although lesser and greater thicknesses can also be employed. A memory cavity may be present in the volume of each memory opening 49 that is not filled with the deposited material layers (52, 54, 56, 60).

A dielectric fill material can be deposited to fill the memory cavities (i.e., unfilled volumes) within the memory openings 49 and the support openings 19. The dielectric fill material can include, for example, silicon oxide or organosilicate glass. The material can be deposited by a conformal deposition method such as low pressure chemical vapor deposition (LPCVD), or by a self-planarizing deposition process such as spin coating. The dielectric fill material and the memory film 50 can be removed from above the top surface of the insulating cap layer 70 by a planarization process, which can include a recess etch process and/or chemical mechanical planarization (CMP) process. A remaining portion of the memory film 50 is present within each memory opening 49. A remaining portion of the semiconductor channel layer is present within each memory opening 49 and constitutes a semiconductor channel 60. A remaining portion of the dielectric fill material is present within each memory opening 49, and is herein referred to as a dielectric core 62.

The dielectric core 62 can be vertically recessed below a horizontal plane including the top surface of the insulating cap layer 70 prior to, during, or after removal of the horizontal portions of the memory film 50 from above the horizontal plane including the top surface of the insulating cap layer 70. Subsequently, a doped semiconductor material having a doping of the first conductivity type can be deposited within the recessed volumes overlying the dielectric cores 62 inside the memory openings 49 to form drain regions 63. For example, the drain regions 63 can include n-doped polysilicon or n-doped amorphous silicon that can be converted into n-doped polysilicon in a subsequent anneal process.

Each combination of a memory film 50 and a semiconductor channel 60 within a memory opening 49 constitutes a memory stack structure (50, 60). The memory stack structure (50, 60) is a combination of a semiconductor channel 60, a tunneling dielectric layer 56, a plurality of memory elements as embodied as portions of the charge storage layer 54, and an blocking dielectric layer 52. Each combination of a memory stack structure (50, 60), a dielectric core 62, and a drain region 63 within a memory opening 49 constitutes a memory opening fill structure 58. The same combination can be formed within each support opening to provide support pillar structured in the contact region 300. The support pillar structures are electrically inactive structures that provide structural support during subsequent replacement of the sacrificial material layers 42 and the sacrificial semiconductor layer 104.

Thus, each memory stack structure (50, 60) includes a semiconductor channel 60 and a memory film 50 laterally surrounding the vertical semiconductor channel 60. An array of memory opening fill structures 58 can extend through each of the at least one alternating stack (32, 42) and into an upper portion of the lower source-level semiconductor layer 112. Generally, an alternating stack of insulating layers 32 and spacer material layers is formed over the upper source-level semiconductor layer 116. The spacer material layers are formed as, or are subsequently replaced with, electrically conductive layers. An array of memory stack structures (50, 60) extends through the alternating stack (32, 42) and at least into the sacrificial semiconductor layer 104. Each of the memory stack structure (50, 60) includes a vertical semiconductor channel 60 and a memory film 50 laterally surrounding the vertical semiconductor channel 60.

Figure 6:
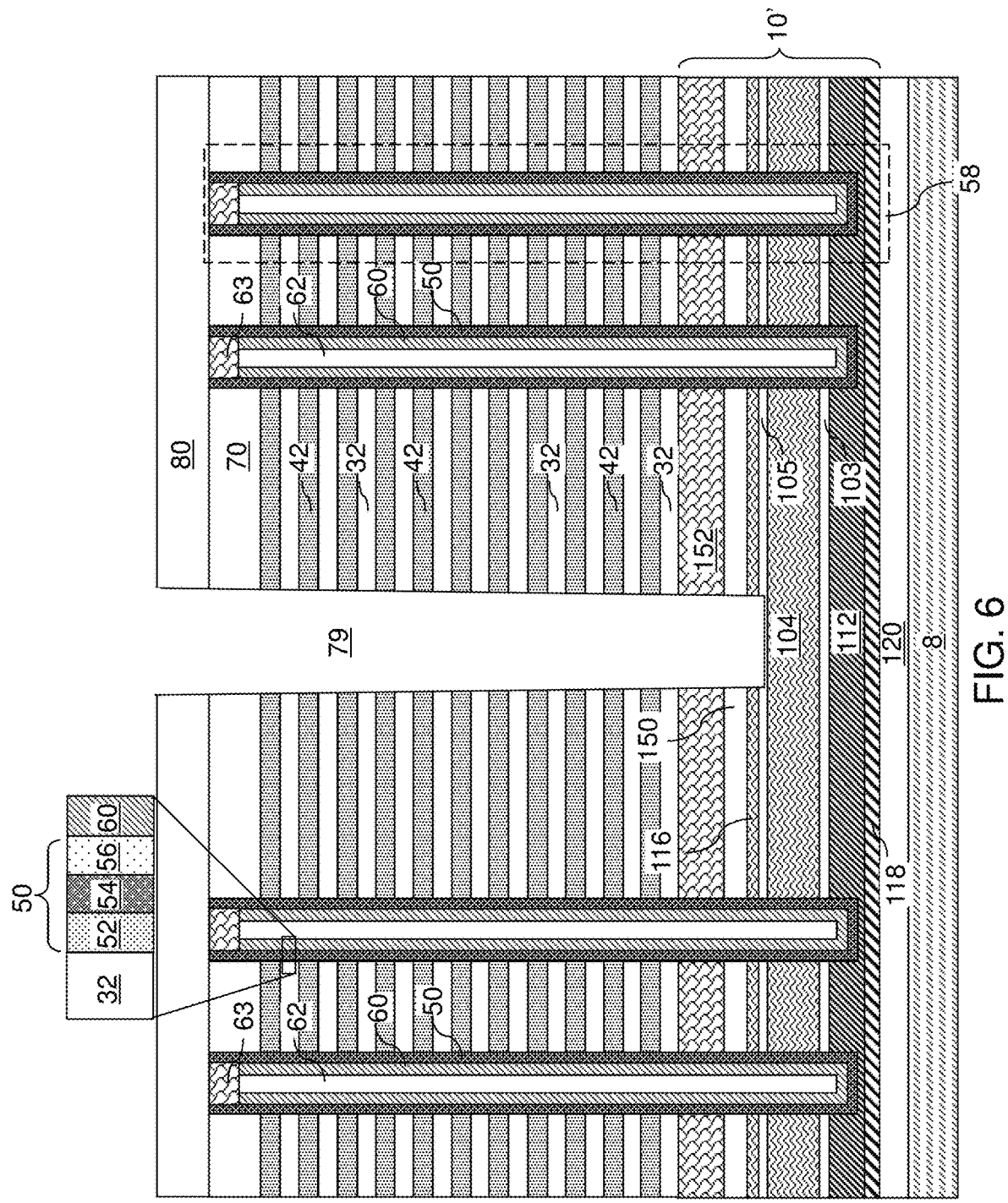
FIG. 6 is vertical cross-sectional view of the first exemplary structure after formation of a backside trench according to the first embodiment of the present disclosure.

Referring to FIG. 6, a contact level dielectric layer 80 can be optionally formed over the insulating cap layer 70. The contact level dielectric layer 80 includes a dielectric material that is different from the dielectric material of the sacrificial material layers 42. For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and can be lithographically patterned to form openings in areas between clusters (e.g., blocks) of memory opening fill structures 58. The pattern in the photoresist layer can be transferred through the contact level dielectric layer 80, the at least one alternating stack (32, 42) and/or the at least one retro-stepped dielectric material portion 65 employing an anisotropic etch to form backside trenches 79. The backside trenches 79 vertically extend from the top surface of the contact level dielectric layer 80, through the alternating stack (32, 42), the source-select-gate semiconductor layer 152, the source-level dielectric layer 150, the upper source-level semiconductor layer 116, and the optional upper sacrificial etch stop layer 105, and down to the sacrificial semiconductor layer 104. The backside trenches 79 can be formed between clusters (e.g., blocks) of memory opening fill structures 58. The photoresist layer can be removed, for example, by ashing.

Figure 7:
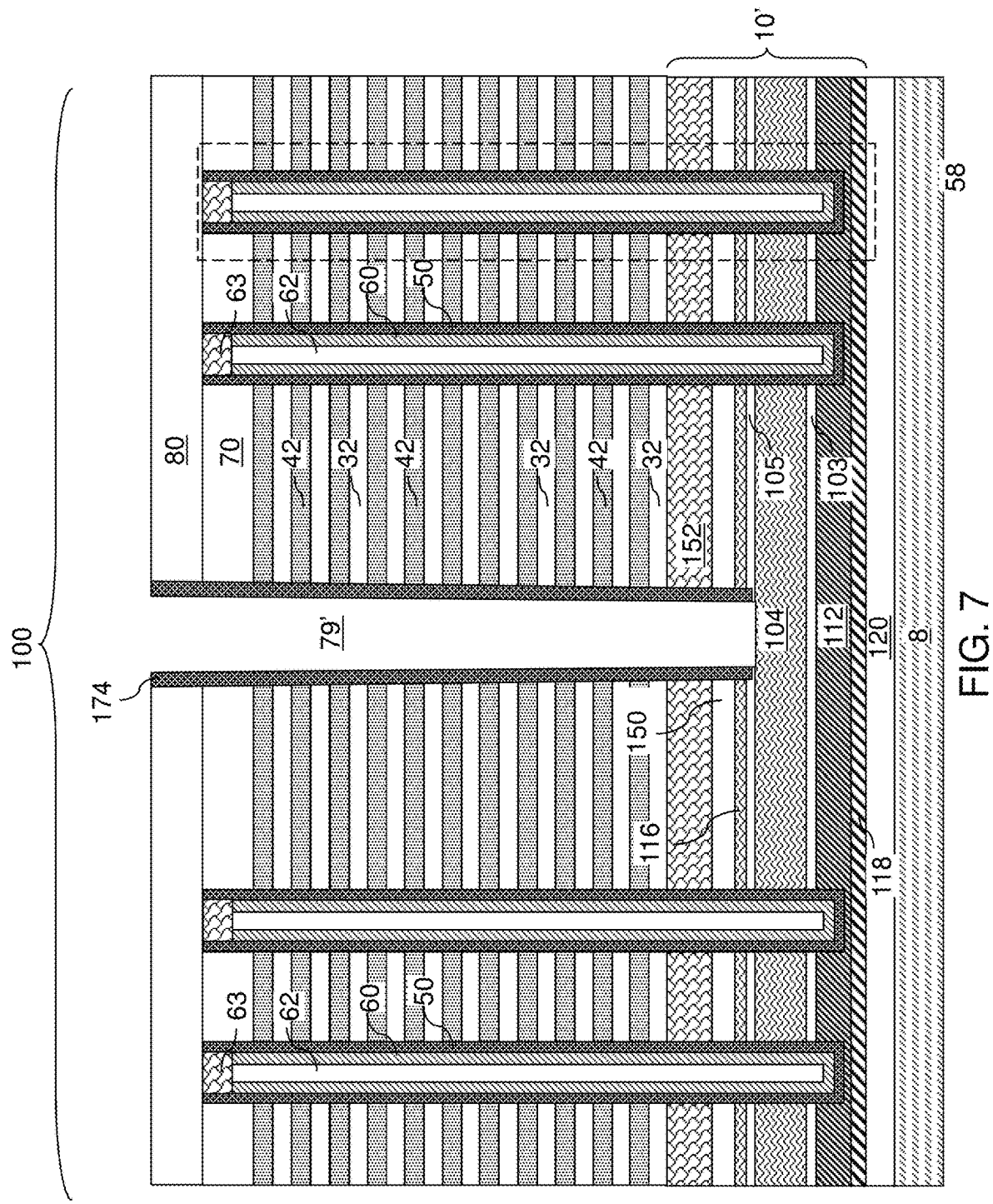
FIG. 7 is a vertical cross-sectional view of the first exemplary structure after formation of a trench spacer according to the first embodiment of the present disclosure.

Referring to FIG. 7, a trench spacer 174 can be formed on the sidewalls of each backside trench 79 by deposition of a conformal material layer and an anisotropic etch. The trench spacer 174 includes a material that is different from the material of the insulating layers 32. For example, the trench spacer 174 can include silicon nitride. Alternatively, the trench spacer 174 can include a dielectric metal oxide such as aluminum oxide or hafnium oxide. Alternatively, the trench spacer 174 can include a silicon oxide material such as doped silicate glass. In this case, the etch rate of the silicon oxide material of the trench spacer 174 can be higher than the etch rate of the insulating layers 32 in dilute hydrofluoric acid to provide selectivity to the insulating layers 32 during subsequent removal of the trench spacer 174. The thickness of the trench spacer 174 can be selected such that a remaining portion of the trench spacer 174 covers the sidewalls of the backside trench after physical exposure of sidewalls of the vertical semiconductor channels in subsequent processing steps. Yet alternatively, the trench spacer 174 can include a metallic nitride material such as TiN, TaN, or WN. The thickness of the trench spacer 174 can be in a range from 10 nm to 30 nm, although lesser and greater thicknesses can also be employed. A trench cavity 79' can be located inside a trench spacer 174 within each backside trench 79. A surface of the sacrificial semiconductor layer 104 is physically exposed at the bottom of each backside trench 79.

Figure 8:
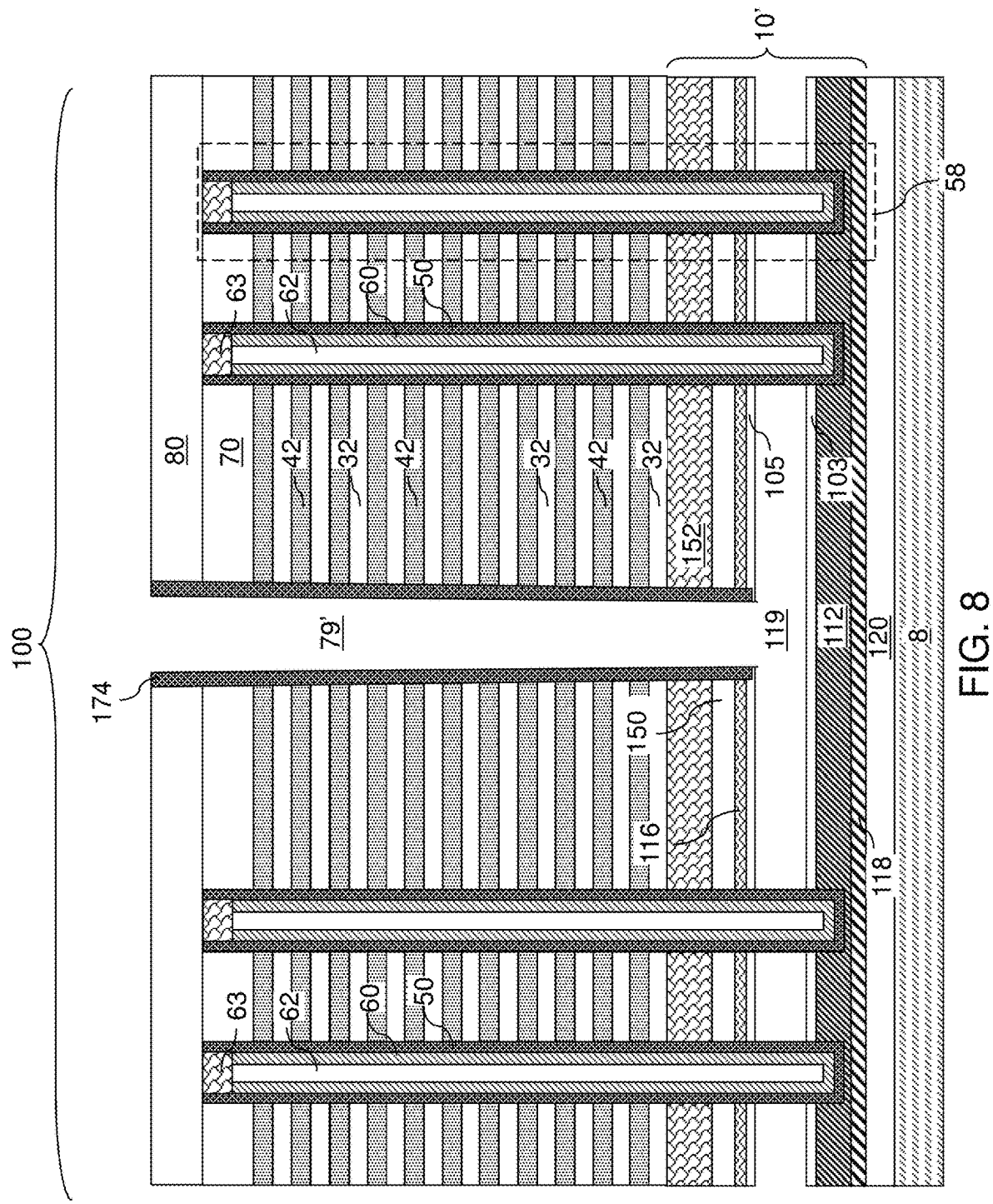
FIG. 8 is a vertical cross-sectional view of the first exemplary structure after formation of a source cavity according to the first embodiment of the present disclosure.

Referring to FIG. 8, a first isotropic etch process can be performed employing an etchant that etches the material of the sacrificial semiconductor layers 104 selective to the lower sacrificial etch stop layer 103, the upper sacrificial etch stop layer 105, and the trench spacers 174. The etchant can be introduced through the backside trenches 79. The etchant can be a liquid phase etchant applied in a wet etch process, or a gas phase etchant applied in a dry etch process. In an illustrative example, the sacrificial semiconductor layer 104 includes amorphous silicon, the lower sacrificial etch stop layer 103 and the upper sacrificial etch stop layer 105 can include silicon oxide, and the trench spacers 174 can include silicon nitride. In this case, a wet etch process employing a trimethyl-2 hydroxyethyl ammonium hydroxide (TMY) solution, a wet etch process employing a KOH solution, or other wet etch processes employing tetramethyl ammonium hydroxide (TMAH), SC-1 (e.g., aqueous ammonium hydroxide and hydrogen peroxide), or $NH_4OH$ solutions, or a dry etch process employing gas phase HCl may be employed to isotropically etch that sacrificial semiconductor layer 104. Each memory film 50 can include a material layer that is not etched by the etchant of the first isotropic etch process. For example, each memory film 50 can include a blocking dielectric layer 52 including a silicon oxide material that is resistant to the etchant of the first isotropic etch process. The sacrificial semiconductor layer 104 can be completely removed. A source cavity 119 can be formed by removal of the sacrificial semiconductor layer 104. Thus, the first isotropic etch process isotropically etches the material of the sacrificial semiconductor layer 104 selective to lower sacrificial etch stop layer 103, the upper sacrificial etch stop layer 105 and a layer within each memory film 50.

Figure 9A:
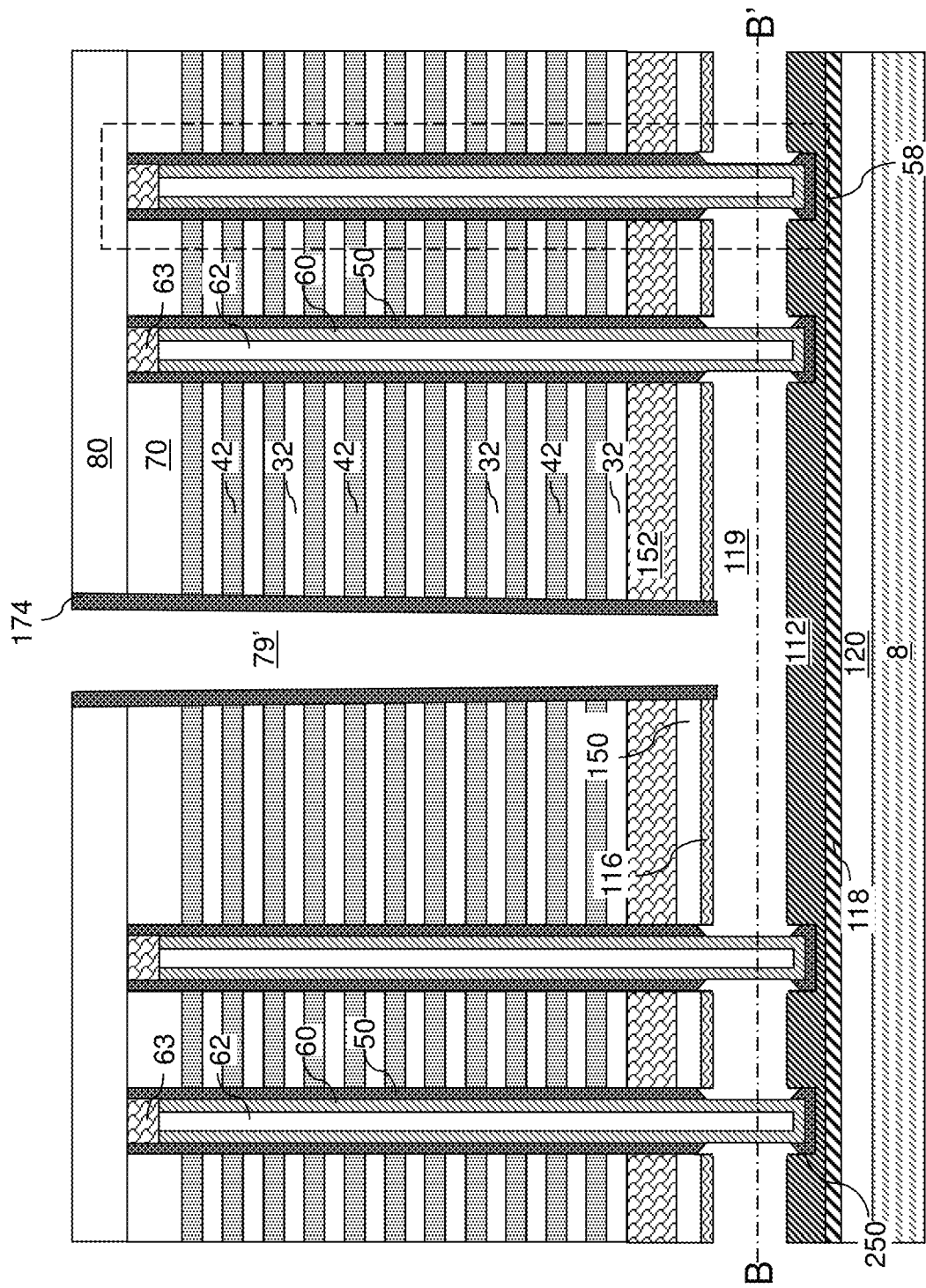
FIG. 9A is a vertical cross-sectional view of the first exemplary structure after removal of physically exposed portions of memory films according to the first embodiment of the present disclosure.
Figure 9C:
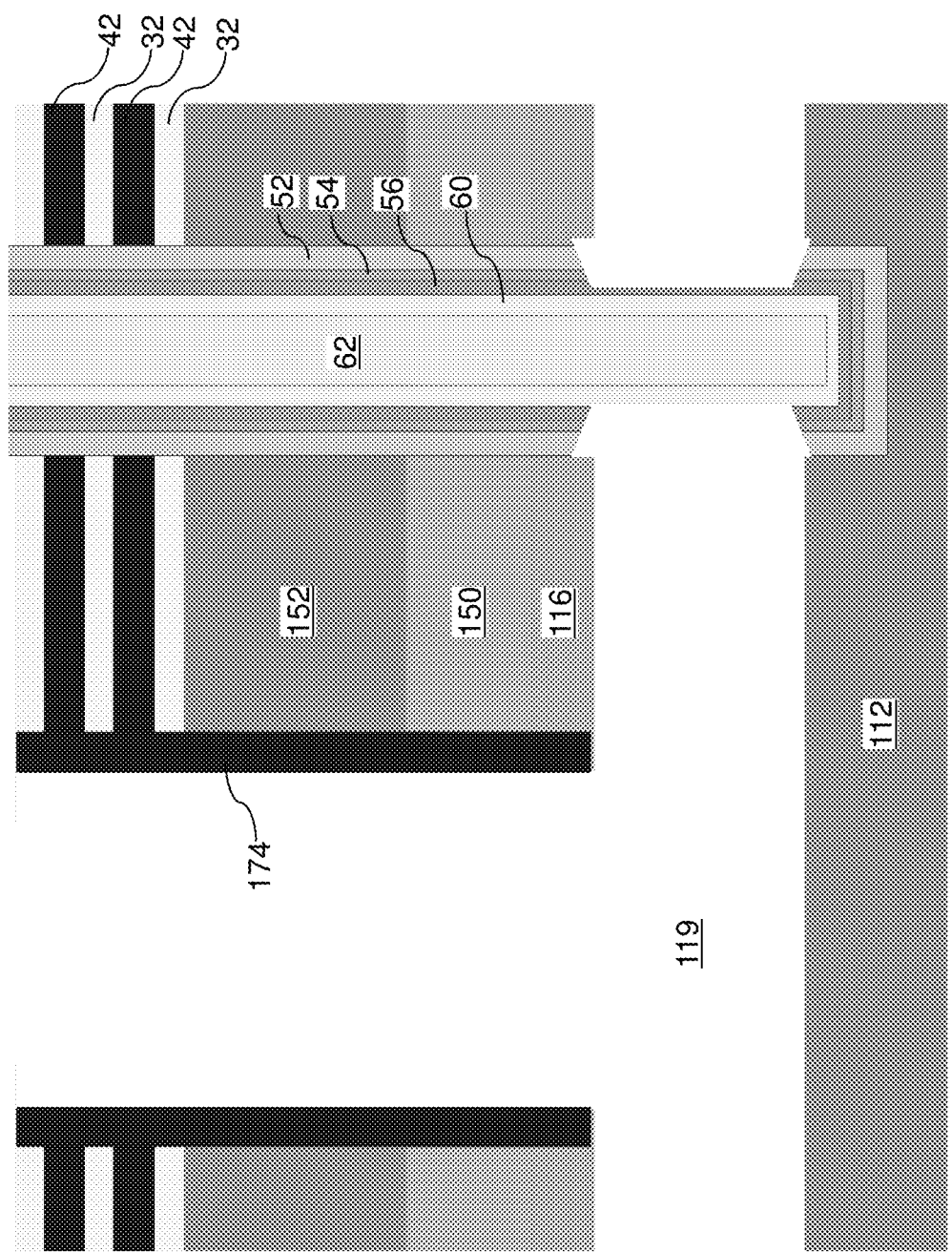
FIG. 9C is a vertical cross-sectional view of a region of the first exemplary structure of FIGS. 9A and 9B that includes a backside trench and a memory stack structure.

Referring to FIGS. 9A-9C, physically exposed portions of memory films 50 are removed at the level of the source cavity 119. Specifically, a second isotropic etch process can be performed by introducing at least another etchant through the backside trenches 79 into the source cavities 119. The second isotropic etch process removes materials of the memory films 50 selective to the semiconductor materials of the lower source-level semiconductor layer 112, the upper source-level semiconductor layer 116, and the semiconductor channels 60. For example, the second isotropic etch process can include a first etch step that etches the material of the blocking dielectric layer 52, a second etch step that etches the material of the charge storage layer 54, and a third etch stop that etches the material of the tunneling dielectric layer 56. In an illustrative example, the blocking dielectric layer 52 can include silicon oxide, the charge storage layer 54 can include silicon nitride, and the tunneling dielectric layer 56 can include silicon oxide or an ONO stack. In this case, the first etch step can include a wet etch or a vapor phase etch employing hydrofluoric acid, the second etch step can employ a wet etch employing hot phosphoric acid, and the third etch step can employ another etch step employing hydrofluoric acid. The source cavity 119 is expanded by removal of portions of the memory films 50 from the level of the source cavity 119, i.e., the level from which the sacrificial material layer 104 is removed.

In one embodiment, the duration of the first etch step can be prolonged after outer surfaces of the charge storage layers 54 are physically exposed to extend the volume of the source cavity 119 vertically around each memory opening fill structure 58. Specifically, the blocking dielectric layer 52 can be etched in the vertical direction perpendicular to the top surface 7 of the substrate 8, i.e., upward to physically expose the optional upper sacrificial etch stop layer 105, and downward to physically expose the optional lower sacrificial etch stop layer 103. The etchant of the first etch step etches the silicon oxide materials of the optional lower sacrificial etch stop layer 103 and the optional upper sacrificial etch stop layer 105 around each memory opening fill structure 58. In one embodiment, the source cavity 119 can vertically extend above the horizontal plane including the top surface of the optional upper sacrificial etch stop layer 105, and below the horizontal plane including the bottom surface of the optional lower sacrificial etch stop layer 103.

The second etch step can etch the physically exposed portions of the charge storage layer 54, and the outer sidewalls of the tunneling dielectric layers 56 can be physically exposed. The third etch step etches the physically exposed portions of the tunneling dielectric layer 56 to physically expose outer surfaces of each semiconductor channel 60 at the level of the source cavity 119. The third etch step can further etch the materials of the lower and optional upper sacrificial etch stop layers (103, 105). The charge storage layer 54 and the tunneling dielectric layer 56 may also be etched in the vertical direction as discussed above to create a larger opening.

A bottom portion of each memory film 50 can be separated from a respective remaining upper portion of the memory film 50 to form a memory material cap portion 250 that underlies a respective vertical semiconductor channel 60. Each of the memory films 50 and the memory material cap portions 250 comprises a stack including, from one side to another, a blocking dielectric layer 52, a charge storage layer 54, and a tunneling dielectric layer 56. Generally, the source cavity 119 can be formed by removing the sacrificial semiconductor layer 104 and portions of the memory films 50 at a level of the sacrificial semiconductor layer 104. Sidewalls of the vertical semiconductor channels 60 are physically exposed around the source cavity 119.

Figure 10:
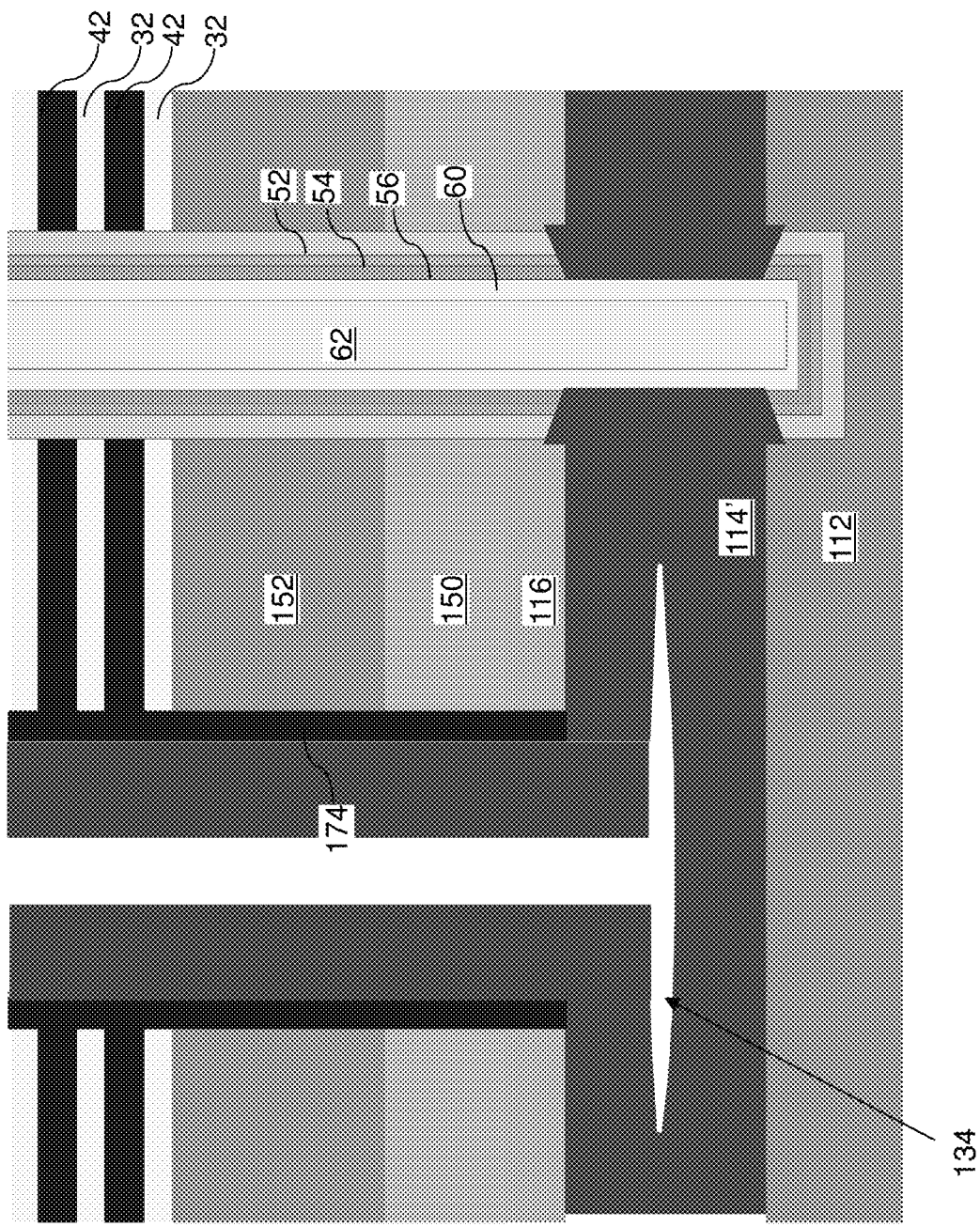
FIG. 10 is a vertical cross-sectional view of the first exemplary structure after formation of an in-process doped source contact layer according to the first embodiment of the present disclosure.

Referring to FIG. 10, an in-process doped source contact layer 114' including a third doped semiconductor material is deposited in the source cavity and at a peripheral region of each backside trench 79. The in-process doped source contact layer 114' can have a doping of the same conductivity as the lower source-level semiconductor layer 112. The in-process doped source contact layer 114' can be formed by a single conformal semiconductor deposition process, or may be formed employing a plurality of conformal semiconductor deposition processes in combination with at least one intervening anisotropic etch process. The conformal deposition for the in-process doped source contact layer 114' can deposit the third doped semiconductor material on all physically exposed surfaces without selectivity. The in-process doped source contact layer 114' can be formed as an amorphous layer to enhance the conformity of the deposited material. In one embodiment, the first doped semiconductor material of the lower source-level semiconductor layer 112, the second doped semiconductor material of the upper source-level semiconductor layer 116, and the third doped semiconductor material of the in-process doped source contact layer 114' can have a doping of the same conductivity type, i.e., the first conductivity type such as n-type.

A conformal deposition process such as a low pressure chemical vapor deposition (LPCVD) process can be employed to deposit the in-process doped source contact layer 114'. While the in-process doped source contact layer 114' is deposited substantially conformally during the generally conformal deposition process, reactant depletion that may occur in a chemical vapor deposition process may cause formation of a tapered seam 134 in the source cavity 119. Specifically, the tapered seam 134 can be formed in the middle of the source cavity 119 by depletion of reactants and resulting loss of perfect conformity during the generally conformal deposition process. In other words, a laterally-extending seam or a laterally extending void may be formed between an upper portion of the in-process doped source contact layer 114' and a lower portion of the in-process doped source contact layer 114' within the source cavity 119. A tapered seam 134 can laterally extend underneath each backside trench 79 at the level of the source cavity 119. An unfilled volume of a backside trench 79 can be present within each backside trench 79. The tapered seam 134 can have a greater height in proximity to each unfilled volume of the backside trench than in proximity to the memory stack structures (50, 60).

Figure 11:
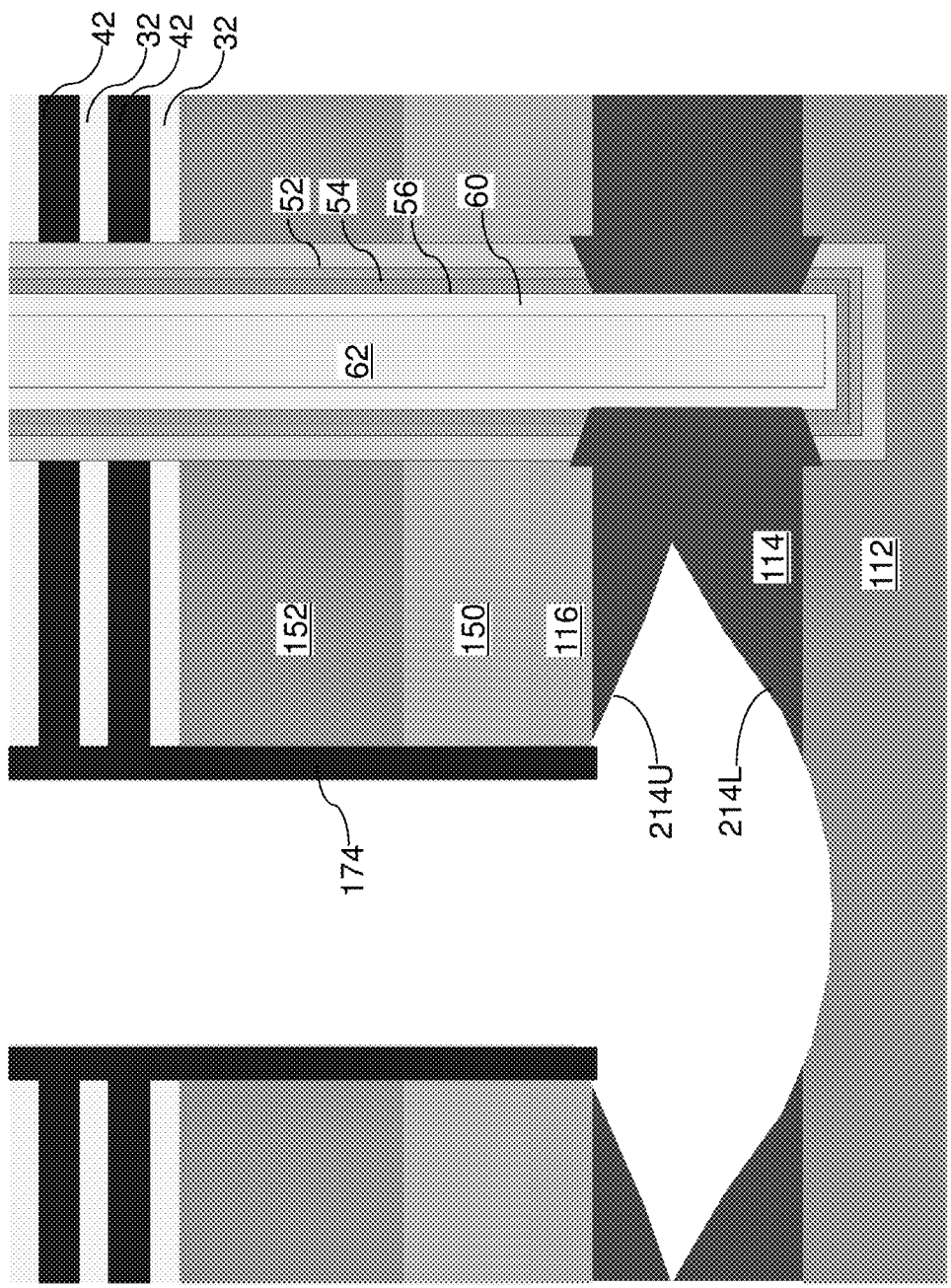
FIG. 11 is a vertical cross-sectional view of the first exemplary structure after formation of a doped source contact layer by an anisotropic etch process according to the first embodiment of the present disclosure.

Referring to FIG. 11, portions of the in-process doped source contact layer 114' located at the peripheral region of each backside trench 79 can be removed at least by an anisotropic and/or an isotropic etch process. Optionally, an isotropic etch process may be employed in combination with the anisotropic etch process. The third doped semiconductor material of the in-process doped source contact layer 114' can be removed from inside each backside trench 79, and the tapered seams 134 can be enlarged by collateral etching that occurs during the etch process.

A remaining portion of the in-process doped source contact layer 114' constitutes a source contact layer 114. The doped source contact layer 114 fills a predominant portion (i.e., more than 50% of the entire volume) of the source cavity 119. The doped source contact layer 114 is formed with an upper tapered surface 214U and a lower tapered surface 214L adjoined to a periphery of the upper tapered surface 214U upon removal of the portions of the in-process doped source contact layer 114' located at the peripheral region of the backside trench 79. Thus, the sacrificial semiconductor layer 104 is replaced with the doped source contact layer 114. The doped source contact layer 114 is formed directly on an outer sidewall of each of the vertical semiconductor channels 60.

Figure 12:
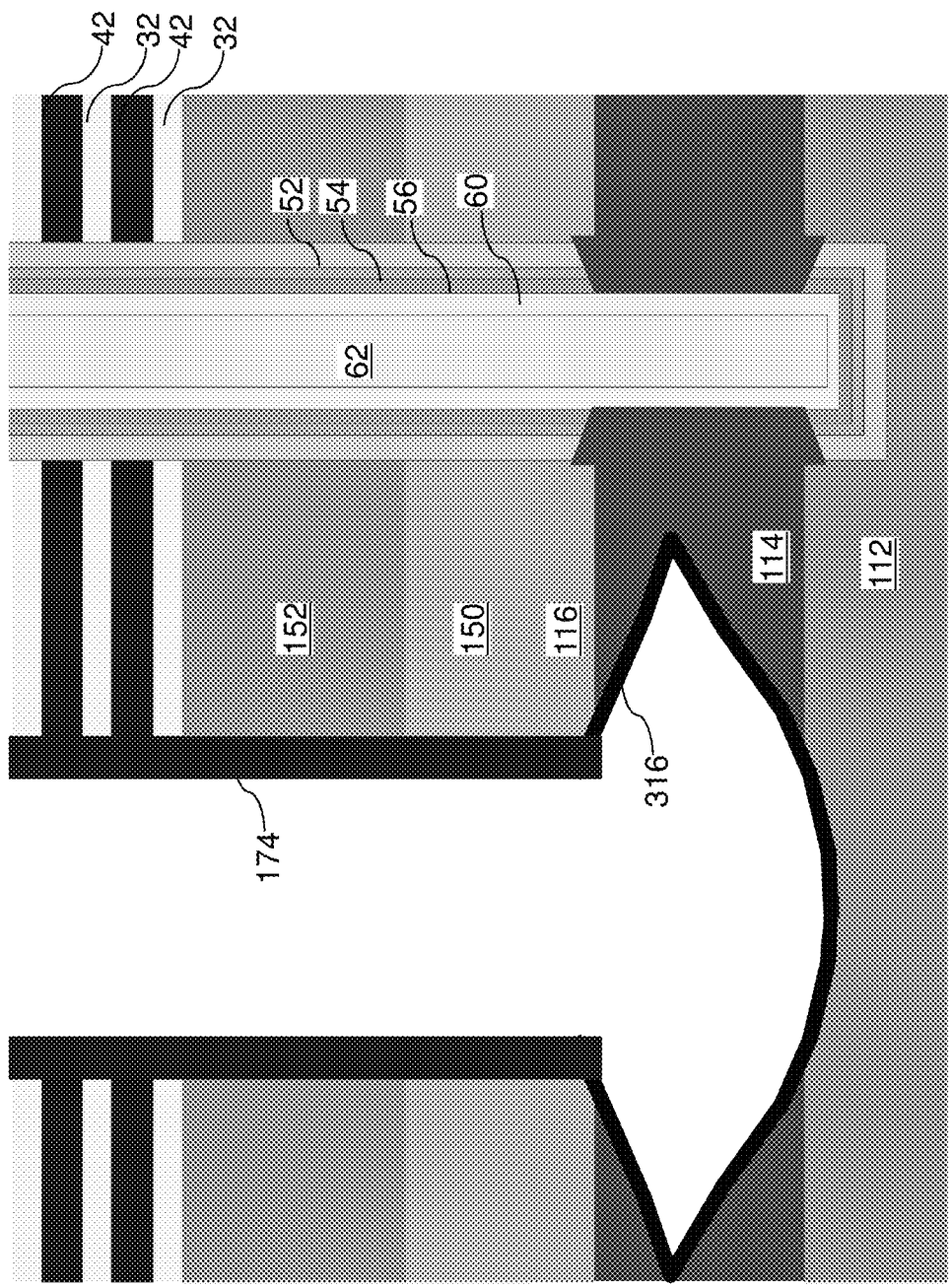
FIG. 12 is a vertical cross-sectional view of the first exemplary structure after formation of a silicon nitride liner according to the first embodiment of the present disclosure.

Referring to FIG. 12, a surface nitridation process can be performed to convert a surface region of the doped source contact layer 114 into a silicon nitride liner 316. Thermal nitridation or plasma nitridation may be employed. The silicon nitride layer 316 is formed by nitridation of physically exposed surfaces of the doped source contact layer 114 while the trench spacers 174 prevent nitridation of the upper source-level semiconductor layer 116 or the source-select-gate semiconductor layer 152. The thickness of the silicon nitride liner 316 can be in a range from 3 nm to 8 nm, although lesser and greater thicknesses can also be employed. The silicon nitride liner 316 can be formed directly on the upper tapered surface 214U and the lower tapered surface 214L of the doped source contact layer 114.

Figure 13A:
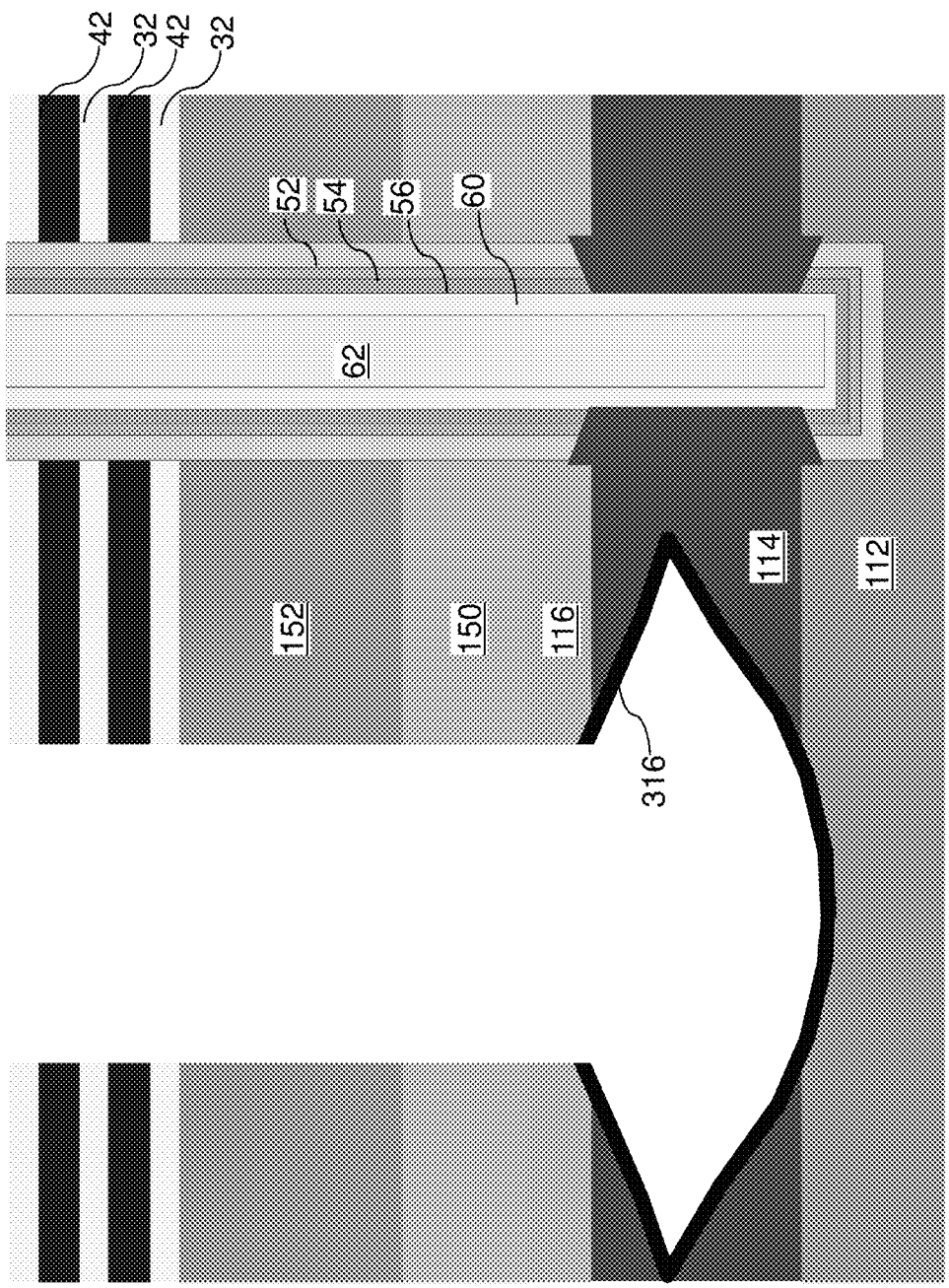
FIG. 13A is a vertical cross-sectional view of the first exemplary structure after removal of the trench spacer according to the first embodiment of the present disclosure.
Figure 13B:
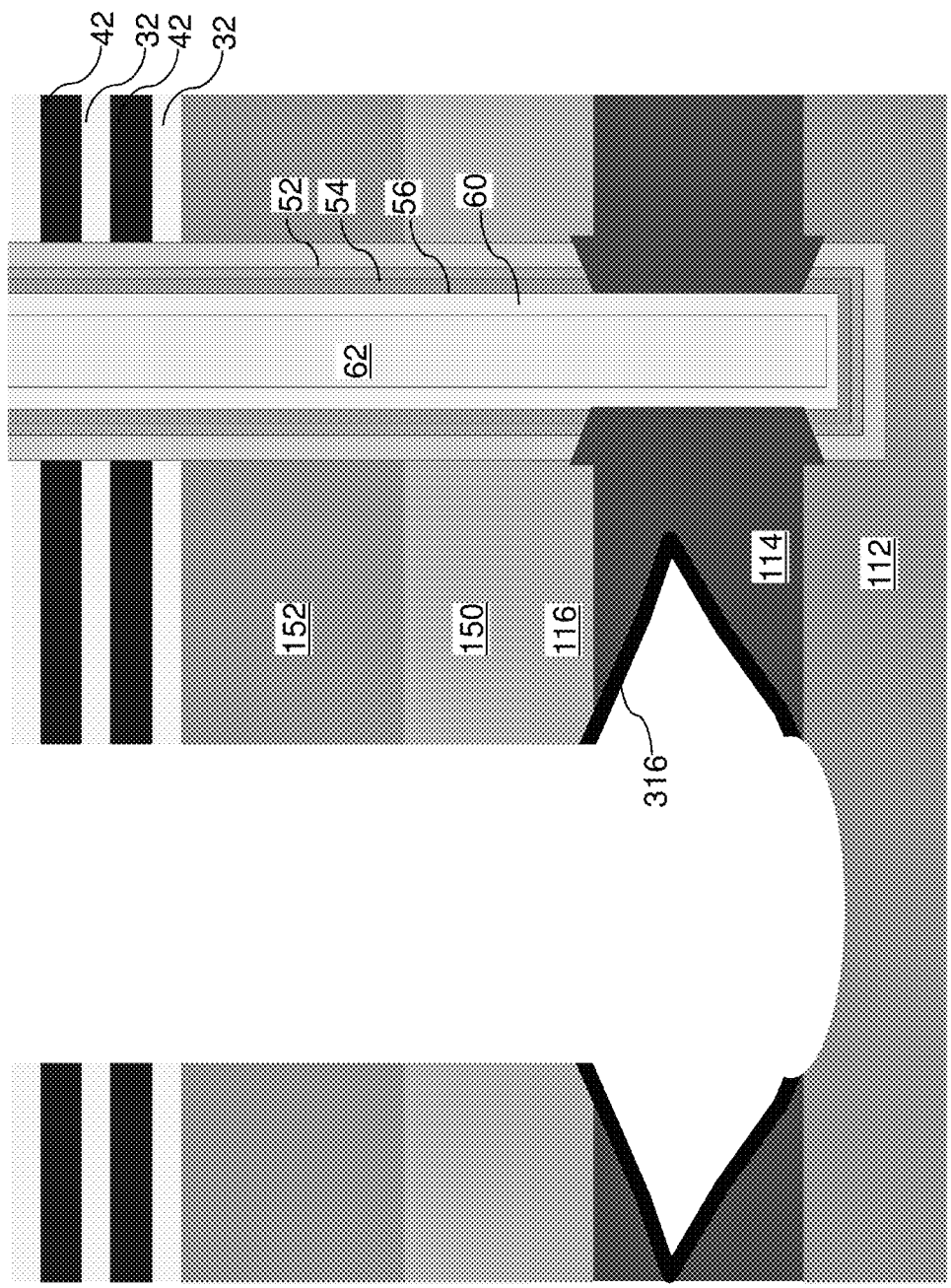
FIG. 13B is an alternative configuration for the first exemplary structure of FIG. 13A.

Referring to FIGS. 13A and 13B, the trench spacers 174 can be removed selective to the dielectric material of the insulating layers 32 and the semiconductor material of the lower source-level semiconductor layer 112. If the trench spacers 174 include a dielectric material other than silicon nitride, an isotropic etch process that removes the material of the trench spacers 174 selective to the materials of the insulating layers 32 and the doped semiconductor material (such as doped polysilicon) of the lower source-level semiconductor layer 112 and the upper source-level semiconductor layer 116 can be employed. For example, if the trench spacers 174 include silicon oxide, a dielectric metal oxide, or a metallic nitride material, a chemical dry etch (CDE) or a wet etch process can be employed to remove the trench spacers 174. The duration of the wet etch process can be controlled to minimize collateral etching of the insulating layers 32. The structure illustrated in FIG. 13A is formed after the etch.

Alternatively, if the trench spacers 174 include silicon nitride, the trench spacers 174 can be removed by an anisotropic etch process. The anisotropic etch process can remove the silicon nitride material of the trench spacers 174 selective to the material of the lower source-level semiconductor layer 112. The etch chemistry of the anisotropic etch process can be selected such that the anisotropic etch process etches silicon nitride selective to the doped semiconductor material (such as doped polysilicon) of the lower source-level semiconductor layer 112. A horizontal portion of each silicon nitride liner 316 underlying each backside trench 79 can be removed by the anisotropic etch process. The structure illustrated in FIG. 13B is formed after the etch.

Figure 14A:
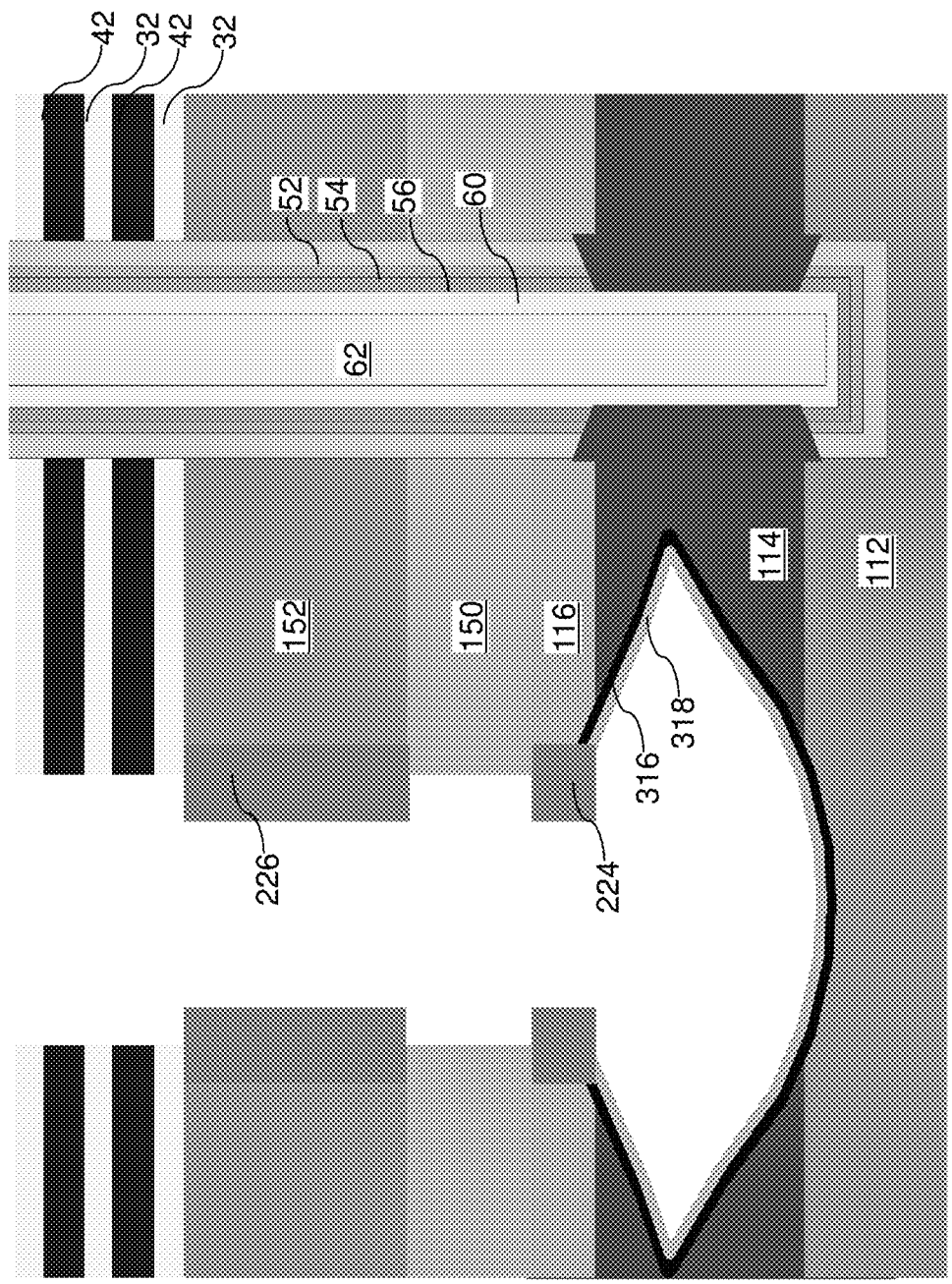
FIG. 14A is a vertical cross-sectional view of the first exemplary structure after an oxidation process according to the first embodiment of the present disclosure.
Figure 14B:
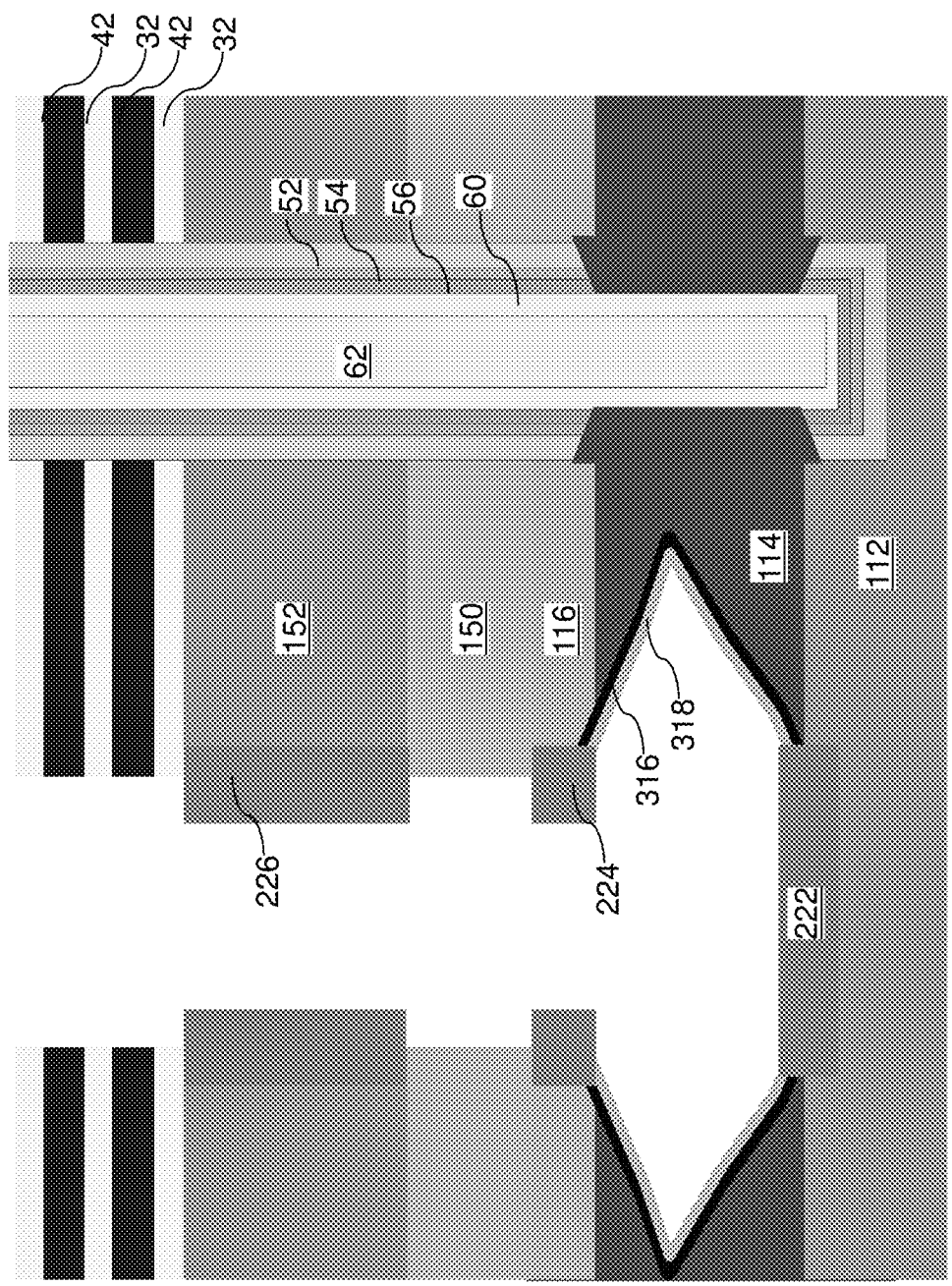
FIG. 14B is an alternative configuration for the first exemplary structure of FIG. 14A.

Referring to FIGS. 14A and 14B, an oxidation process can be performed to convert a surface portion of the silicon nitride liner 316 into a silicon oxide liner 318, and to convert physically exposed surface portions of the semiconductor materials of the lower source-level semiconductor layer 112, the upper source-level semiconductor layer 116, and the source-select-gate semiconductor layer 152 into semiconductor oxide (e.g., silicon oxide) portions (222, 224, 226). A thermal oxidation process or a plasma oxidation process may be employed. The process conditions of the oxidation process are selected such that only a surface portion of the silicon nitride liner 316 is converted into a thin silicon oxide liner 318, and a thinned silicon nitride liner 316 remains on the surfaces of the doped source contact layer 114. If an isotropic etch process is employed to remove the trench spacers 174, the remaining portion of the silicon nitride liner 316 prevents formation of a thick oxide layer on the lower source-level semiconductor layer 112 as illustrated in FIG. 14A. In case of an anisotropic etch process is employed to remove the trench spacers 174, a thick lower source-level semiconductor oxide spacer 222 including an oxide of the first doped semiconductor material can be formed from each physically exposed surface of the lower source-level semiconductor layer 112 as illustrated in FIG. 14B.

An upper source-level semiconductor oxide spacer 224 can be formed from each physically exposed sidewall of the upper source-level semiconductor layer 116. A source-select-gate semiconductor oxide spacer 226 can be formed from each physically exposed sidewall of the source-select-gate semiconductor layer 152. Each optional lower source-level semiconductor oxide spacer 222, in the configuration of FIG. 14B, can comprise an oxidized surface portion of the lower source-level semiconductor layer 112. Each upper source-level semiconductor oxide spacer 224 can comprise an oxidized surface portion of the upper source-level semiconductor layer 116, and each source-select-gate semiconductor oxide spacer 226 can comprise an oxidized surface portion of the source-select-gate semiconductor layer 152. The remaining portion of the silicon nitride liner 316 prevents or reduces oxidation of the doped source contact layer 114. The optional lower source-level semiconductor oxide spacers 222, the upper source-level semiconductor oxide spacers 224, and the source-select-gate semiconductor oxide spacers 226 can have a thickness in a range from 3 nm to 20 nm, such as from 6 nm to 10 nm, although lesser and greater thicknesses can also be employed. The thinned silicon nitride liner 316 can have a thickness in a range from 2 nm to 6 nm, although lesser and greater thicknesses can also be employed. The silicon oxide liner 318 can have a thickness in a range from 2 nm to 6 nm, although lesser and greater thicknesses can also be employed.

Figure 15A:
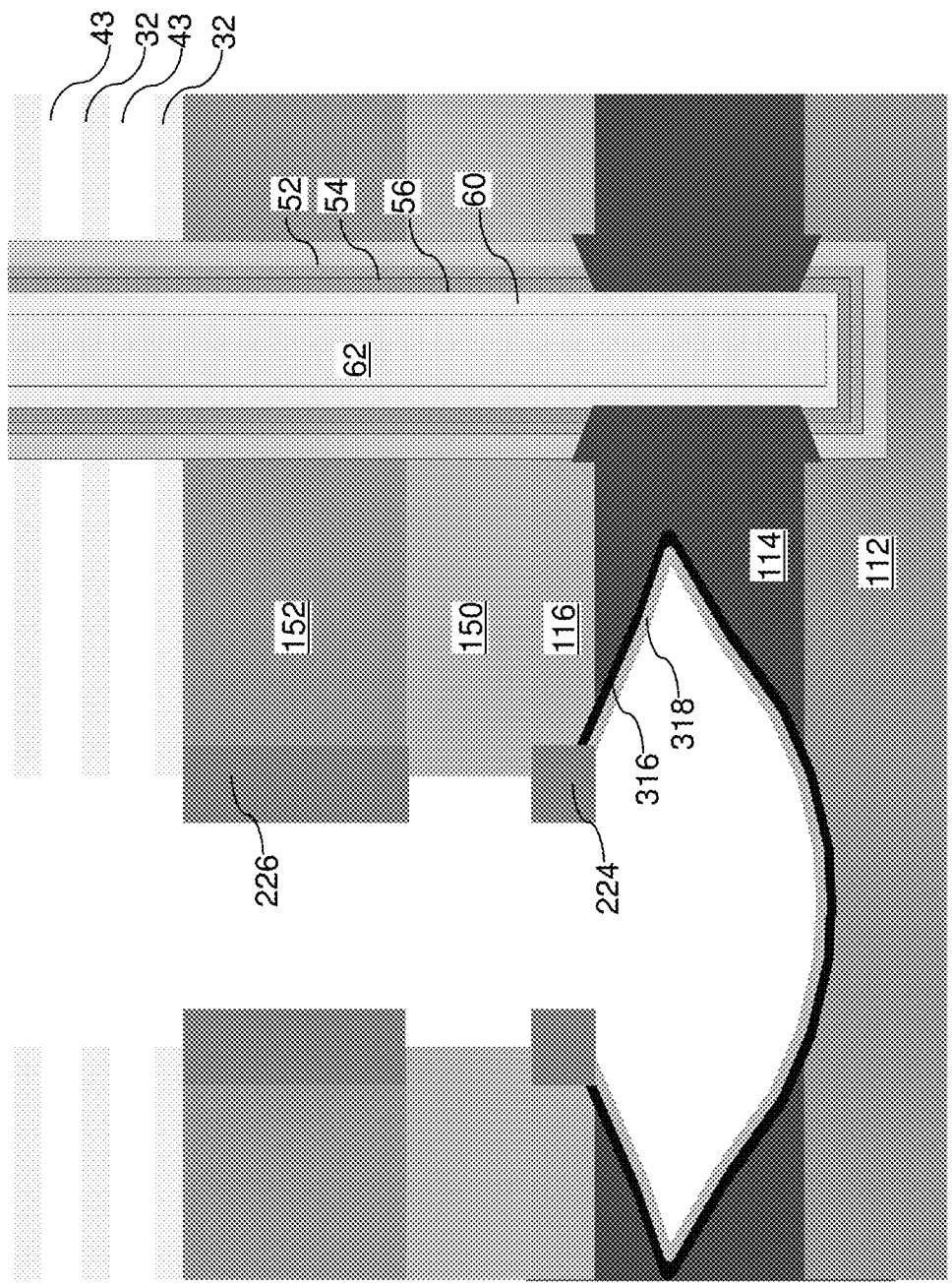
FIG. 15A is a vertical cross-sectional view of the first exemplary structure after formation of backside recesses according to the first embodiment of the present disclosure.
Figure 15B:
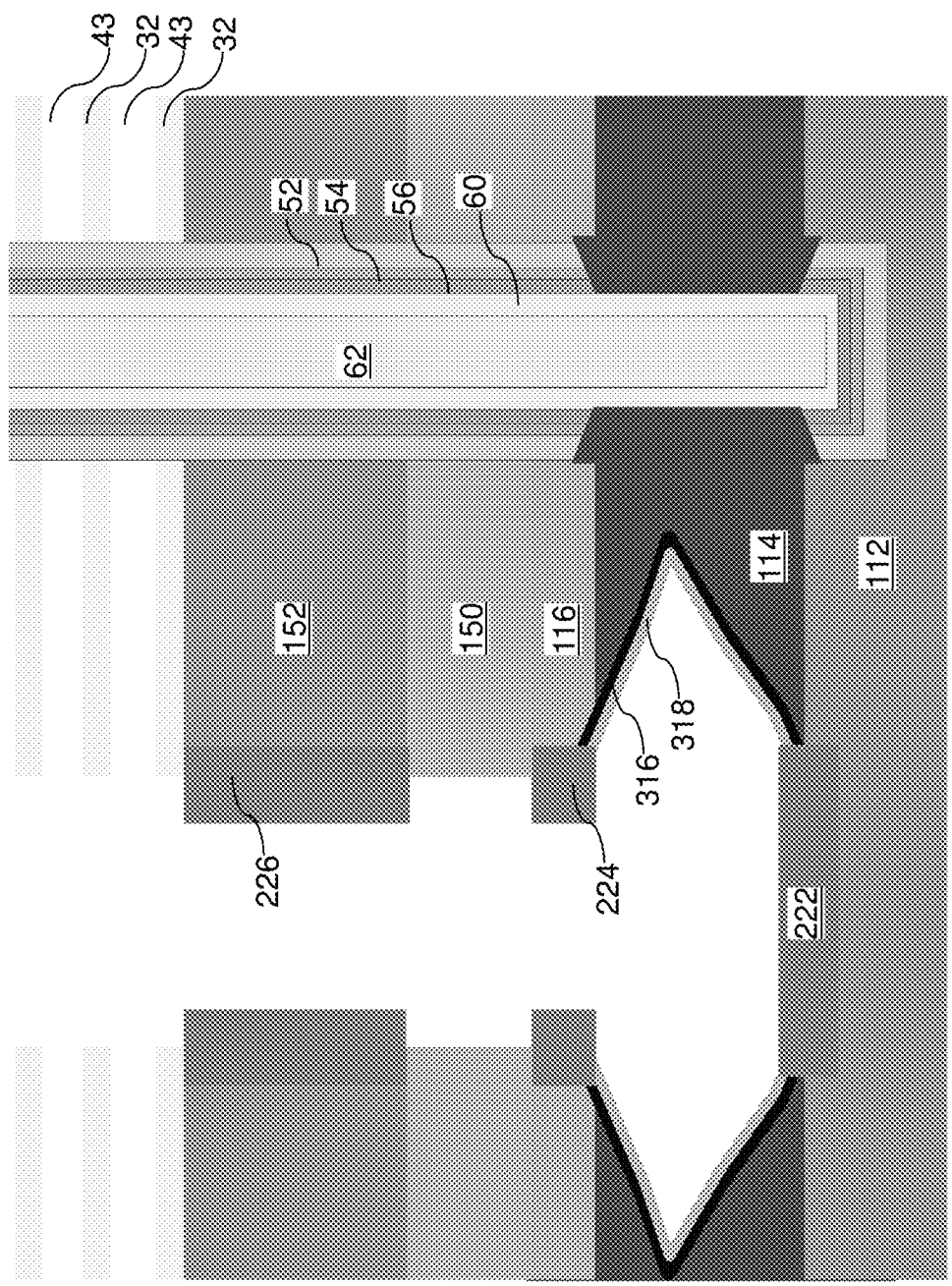
FIG. 15B is an alternative configuration for the first exemplary structure of FIG. 15A.

Referring to FIGS. 15A and 15B, an etchant that selectively etches the second material of the sacrificial material layers 42 with respect to the first material of the insulating layers 32 can be introduced into the backside trenches 79 employing an isotropic etch process such as a wet etch process.

Backside recesses 43 are formed in volumes from which the sacrificial material layers 42 are removed. The removal of the second material of the sacrificial material layers 42 can be selective to the first material of the insulating layers 32, the material of retro-stepped dielectric material portion 65, the material of the outermost layer of the memory films 50 (e.g., the blocking dielectric layer 52), and the semiconductor materials of the source-select-gate semiconductor layer 152 and the upper source-level semiconductor layer 116. In one embodiment, the sacrificial material layers 42 can include silicon nitride, and the materials of the insulating layers 32 and the retro-stepped dielectric material portion 65 can include silicon oxide materials.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. In this case, the silicon oxide liner 318, the lower source-level semiconductor oxide spacers 222, the upper source-level semiconductor oxide spacers 224, and the source-select-gate semiconductor oxide spacers 226 protect the various material of the lower source-level semiconductor layer 112, the doped source contact layer 114, the upper source-level semiconductor layer 116, and the source-select-gate semiconductor layer 152.

The memory opening fill structures 58 in the memory array region 100, the support pillar structure provided in the contact region 300, and the retro-stepped dielectric material portion 65 can provide structural support while the backside recesses 43 are present within volumes previously occupied by the sacrificial material layers 42. Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed.

The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 16A:
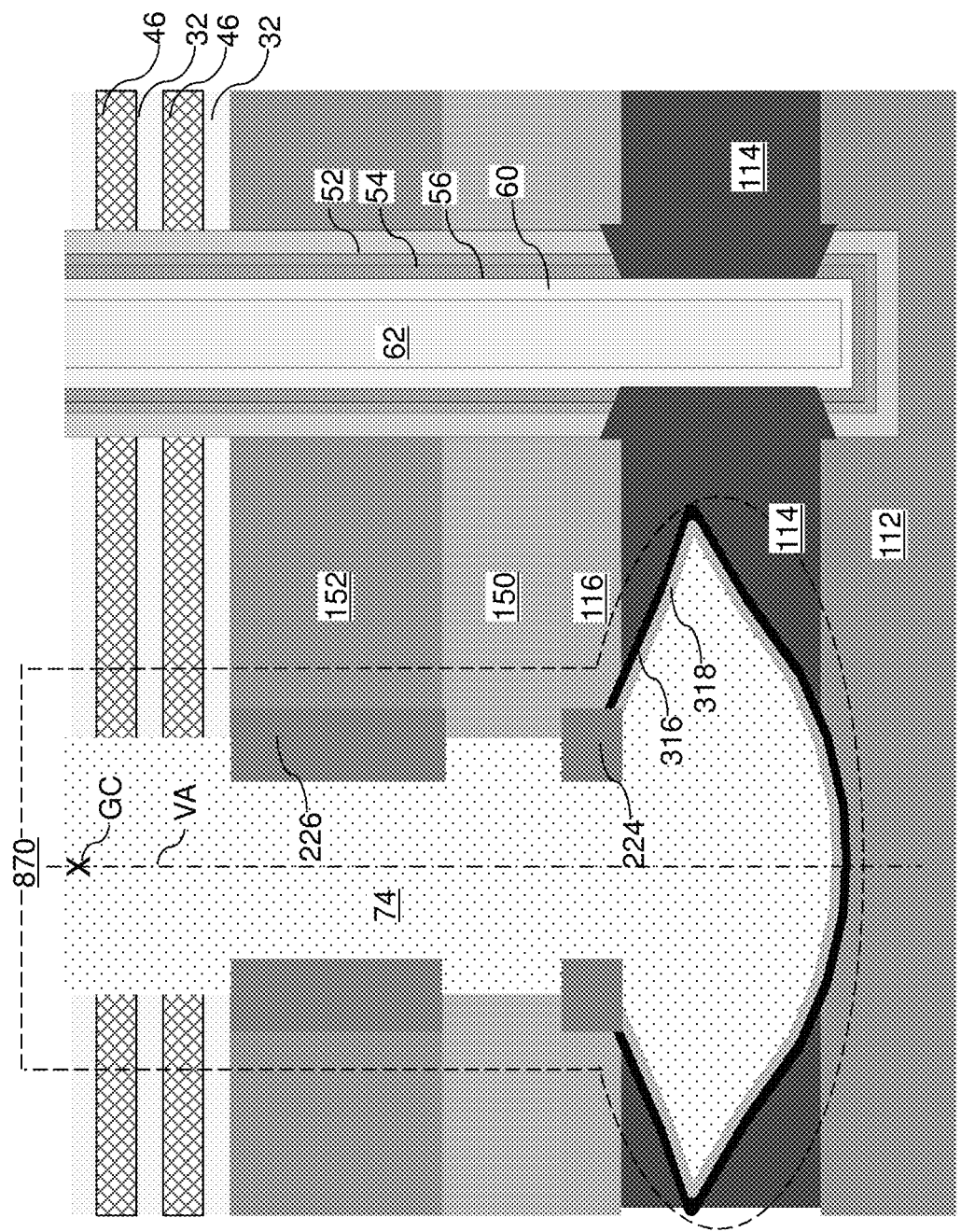
FIG. 16A is a vertical cross-sectional view of the first exemplary structure after formation of electrically conductive layers and a dielectric wall structure according to the first embodiment of the present disclosure.
Figure 16B:
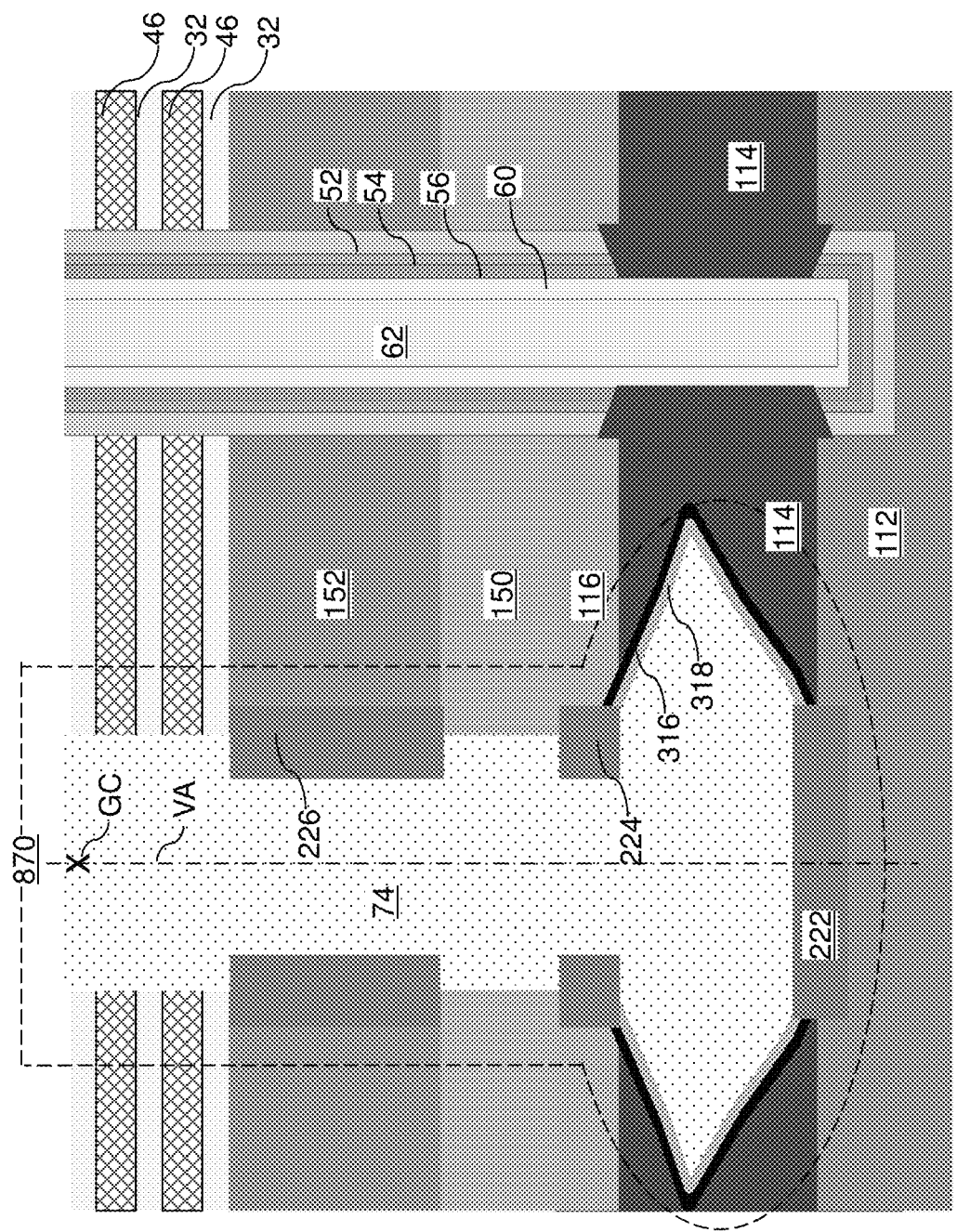
FIG. 16B is an alternative configuration for the first exemplary structure of FIG. 16A.

Referring to FIGS. 16A and 16B, a backside blocking dielectric layer (not shown) can be optionally formed as a continuous material layer in the backside recesses 43 and the backside trenches 79 and over the contact level dielectric layer 80. The backside blocking dielectric layer, if present, comprises a dielectric material that functions as a control gate dielectric for the control gates to be subsequently formed in the backside recesses 43. At least one metallic material can be subsequently deposited in the backside recesses 43 and the backside trenches 79. For example, a combination of a metallic barrier layer (which may include a conductive metallic nitride material such as TiN, TaN, WN, or a stack thereof) and at least one metal fill material layer (such as a tungsten layer) can be deposited by conformal deposition processes such as chemical vapor deposition (CVD) or atomic layer deposition (ALD). A plurality of electrically conductive layers 46 can be formed in the plurality of backside recesses 43, and a continuous metallic material layer 46L can be formed on the sidewalls of each backside trench 79 and over the contact level dielectric layer 80. Each electrically conductive layer 46 includes a portion of the metallic barrier layer and a metallic fill material portion. Thus, each sacrificial material layer 42 can be replaced with an electrically conductive layer 46. A backside cavity is present in the portion of each backside trench 79 that is not filled with the backside blocking dielectric layer and the continuous metallic material layer 46L.

The deposited metallic material of the continuous electrically conductive material layer 46L is etched back from the sidewalls of each backside trench 79, from above the surfaces of the silicon oxide liner 318, and from above the contact level dielectric layer 80, for example by an isotropic wet etch process. An anisotropic dry etch may be additionally employed to facilitate removal of the metallic material from inside each backside trench 79. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 can include the control gate electrodes for the vertical memory devices including the memory opening fill structures 58. In other words, each electrically conductive layer 46 can be a word line that functions as a common control gate electrode for the plurality of vertical memory devices. One or more of the uppermost electrically conductive layers 46 can function as a drain select gate of a vertical NAND string, while the source-select-gate semiconductor layer 152 can function as a source select gate of the vertical NAND string.

An insulating material (such as silicon oxide) can be deposited in the backside cavities to form a dielectric wall structure 74 in each backside trench 79. Excess portions of the insulating material overlying the contact level dielectric layer 80 may, or may not, be removed. Each dielectric wall structure 74 contacts sidewalls of the insulating layers 32 and the electrically conductive layers 46. In one embodiment, each dielectric wall structure 74 can contact the silicon oxide liner 318, the source-select-gate semiconductor oxide spacer 226, the upper source-level semiconductor oxide spacer 224, and the lower source-level semiconductor oxide spacer 222 (if present).

A backside trench fill assembly 870 fills each backside trench 79. Each backside trench fill assembly 870 comprises a dielectric wall structure 74, a silicon oxide liner 318, a silicon nitride liner 316, a source-select-gate semiconductor oxide spacer 226, an upper source-level semiconductor oxide spacer 224, and an optional lower source-level semiconductor oxide spacer 222. A geometrical center GC of the dielectric wall structure 74 and a vertical axis VA that passes through the geometrical center GC of the dielectric wall structure 74 are illustrated in FIGS. 16A and 16B. As used herein, a geometrical center GC of any element is the center of mass of a hypothetical element filling the volume of the element and having a uniform density throughout.

Figure 17:
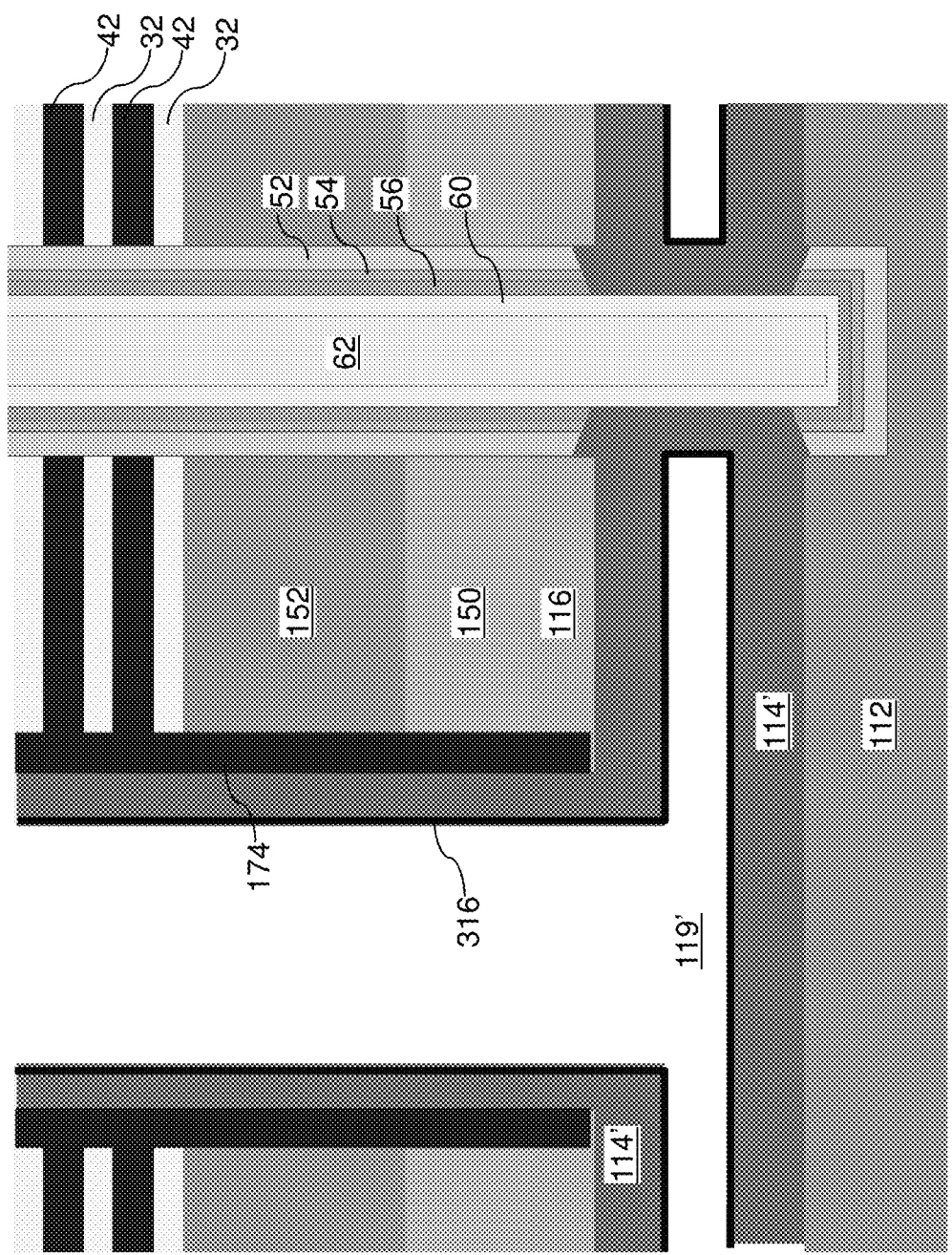
FIG. 17 is a vertical cross-sectional view of a second exemplary structure after formation of an in-process doped source contact layer and a silicon nitride liner according to a second embodiment of the present disclosure.

Referring to FIG. 17, a second exemplary structure according to a second embodiment of the present disclosure is derived from the first exemplary structure of FIGS. 9A-9C by depositing an in-process doped source contact layer 114' and by forming a silicon nitride liner 316 by nitridation of the surface portion of the in-process doped source contact layer 114' and/or conformal deposition of a silicon nitride material. In the second embodiment, the thickness of the in-process doped source contact layer 114' is selected such that an unfilled gap 119' is present within the source cavity 119 after formation of the in-process doped source contact layer 114'. The in-process doped source contact layer 114' can be formed by a non-selective conformal deposition process with a uniform thickness throughout. The thickness of the silicon nitride liner 316 can be in a range from 3 nm to 8 nm, although lesser and greater thicknesses can also be employed.

Figure 18:
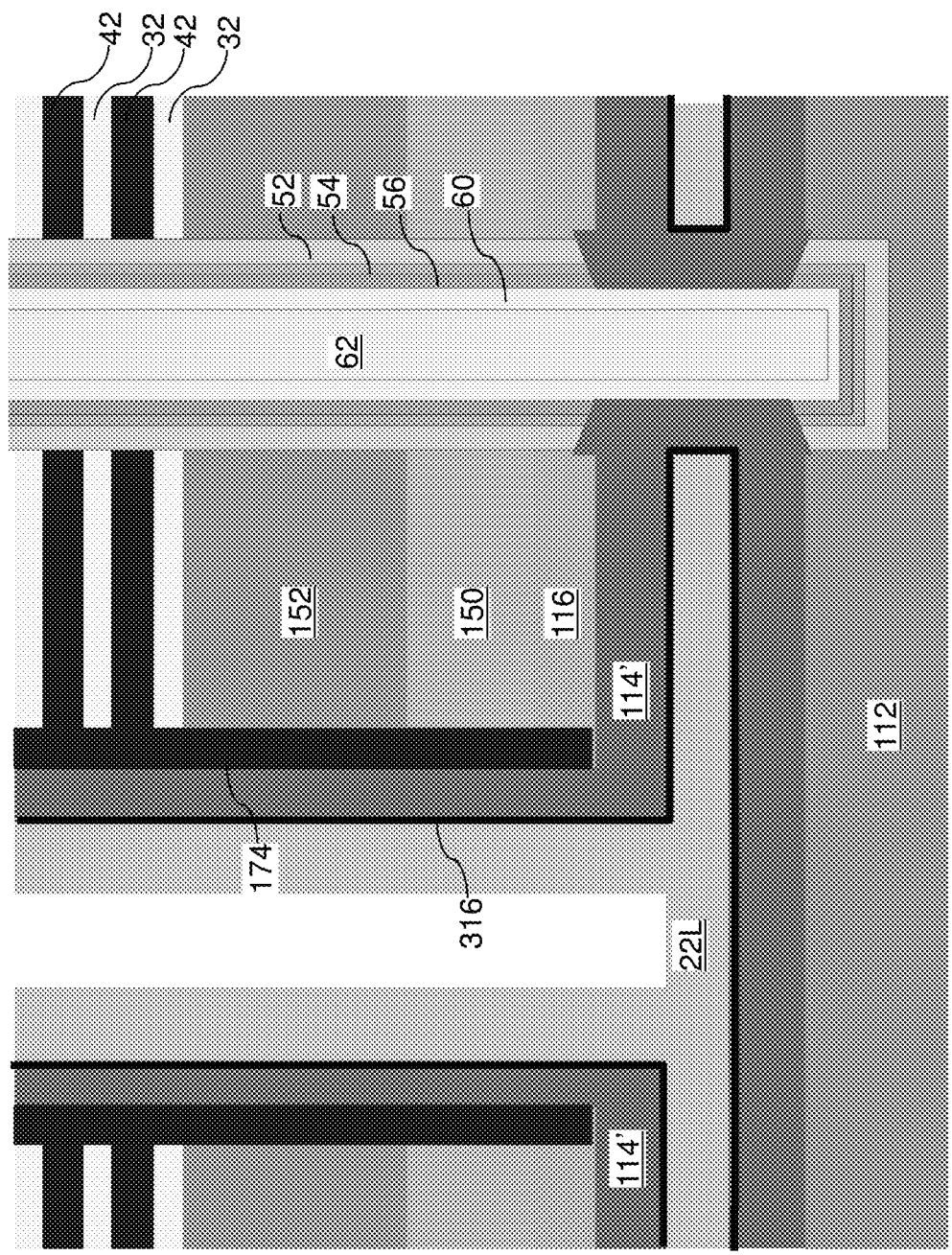
FIG. 18 is a vertical cross-sectional view of the second exemplary structure after formation of a conformal dielectric material layer according to the second embodiment of the present disclosure.

Referring to FIG. 18, a conformal dielectric material layer 22L can be deposited in the unfilled gap 119' in the source cavity 119 by a conformal deposition process. In one embodiment, the conformal dielectric material layer 22L can include a silicon oxide-based material such as undoped silicate glass or doped silicate glass.

Figure 19:
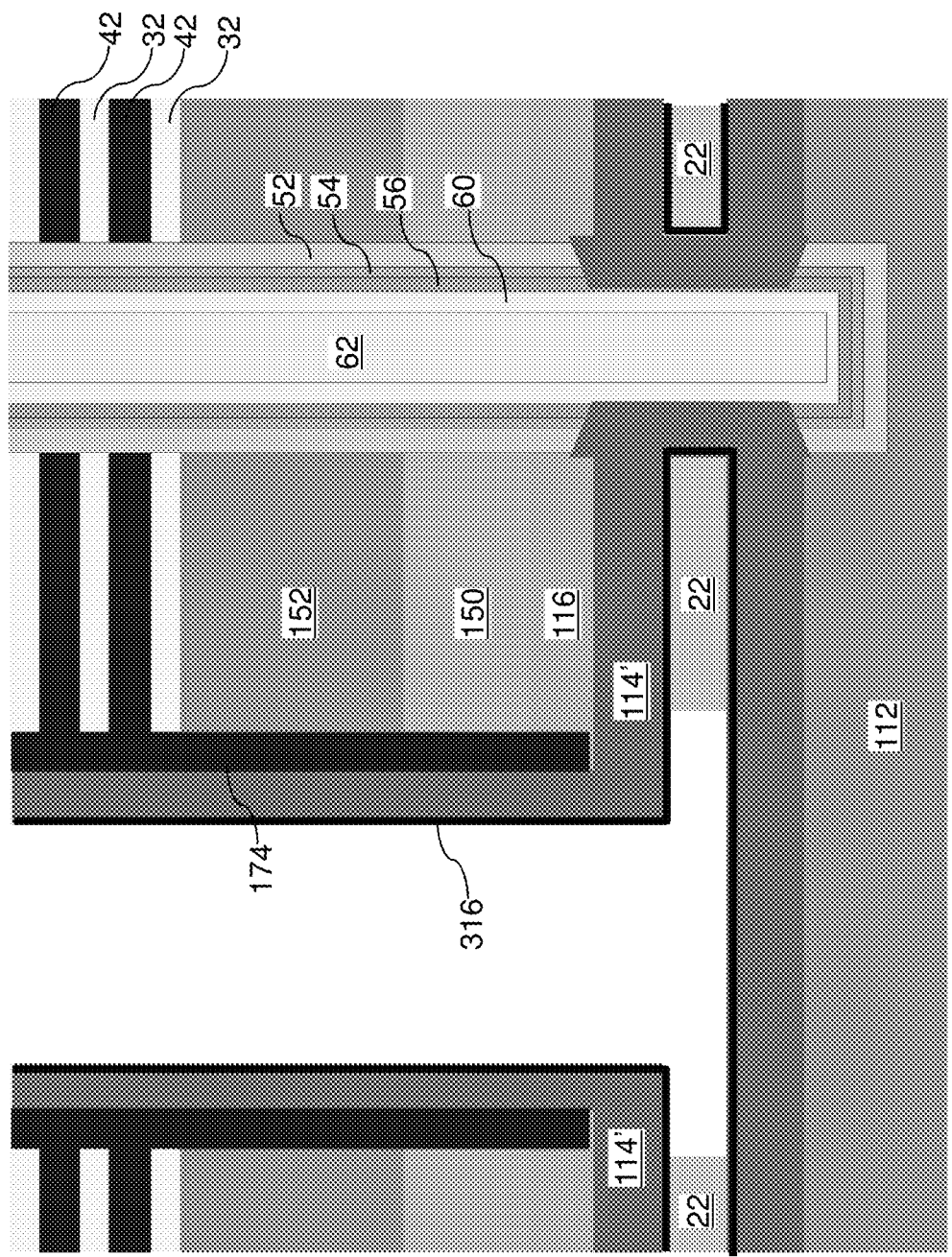
FIG. 19 is a vertical cross-sectional view of the second exemplary structure after formation of source-level dielectric cores by recessing the conformal dielectric material layer according to the second embodiment of the present disclosure.

Referring to FIG. 19, the conformal dielectric material layer 22L can be isotropically recessed by CDE to remove portions of the conformal dielectric material layer 22L in the backside trenches 79 and from above the contact level dielectric layer 80. The remaining portions of the conformal dielectric material layer 22L constitute source-level dielectric cores 22, which can be laterally recessed from vertical planes including the sidewalls of the backside trenches 79 by a same lateral offset distance. In one embodiment, the source-level dielectric cores 22 can include undoped silicate glass or doped silicate glass.

Figure 20:
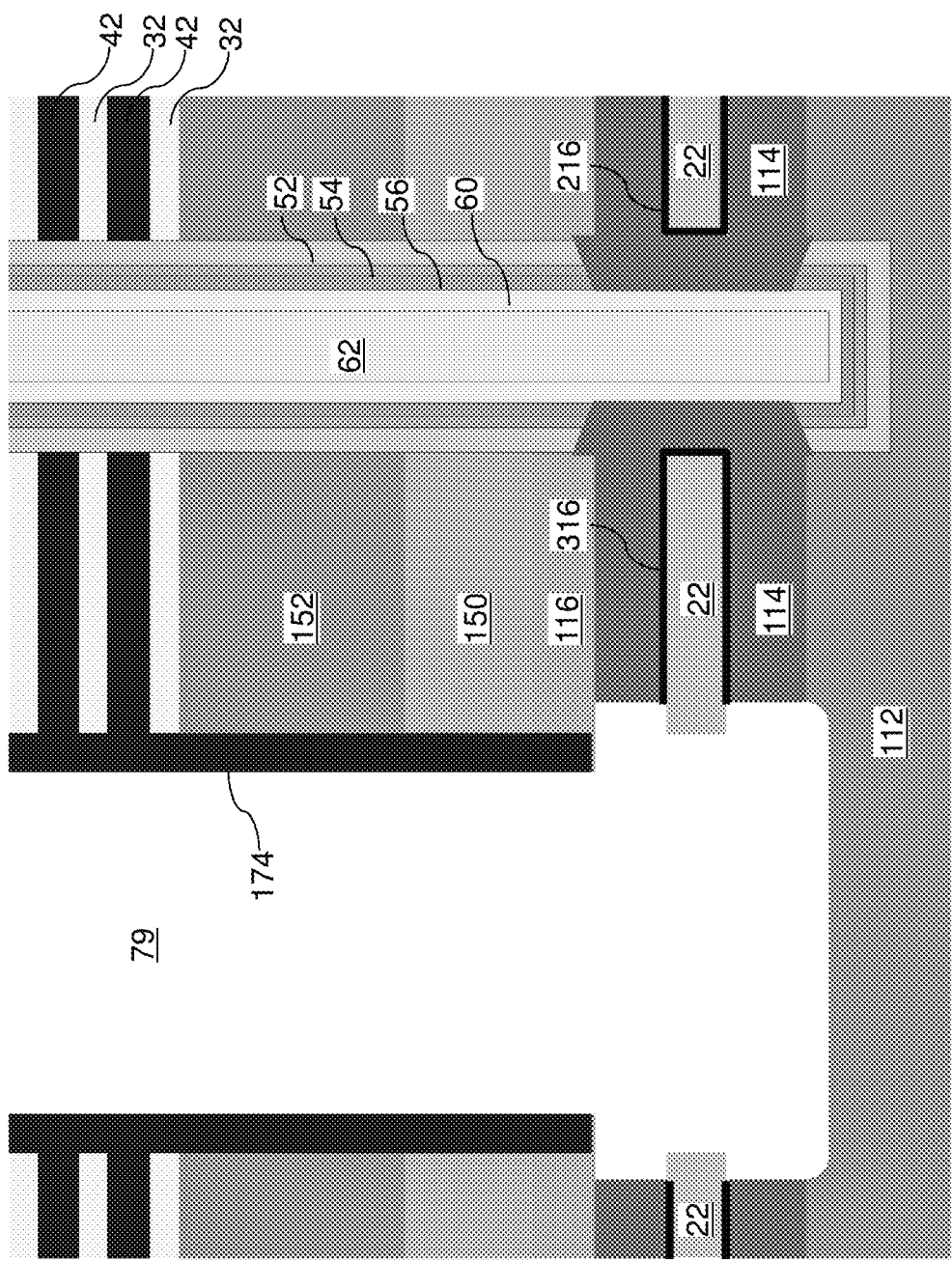
FIG. 20 is a vertical cross-sectional view of the second exemplary structure after removing portions of the silicon nitride liner and the in-process doped source contact layer according to the second embodiment of the present disclosure.

Referring to FIG. 20, physically exposed portions of the silicon nitride liner 316 can be removed from inside the backside trenches 79 by an isotropic etch process. The isotropic etch process can be CDE process. Remaining portions of the silicon nitride liner 316 can be located between the in-process doped source contact layer 114' and a respective source-level dielectric core 22.

Portions of the in-process doped source contact layer 114' can be removed by an isotropic etch process. The isotropic etch process can include a CDE process that etches the third doped semiconductor material of the in-process doped source contact layer 114' selective to the trench spacers 174 and the source-level dielectric cores 22. Portions of the silicon nitride liner 326 and the in-process doped source contact layer 114' that are located at the peripheral regions of the backside trenches 79 are removed. The duration of the wet etch process can be selected to minimize collateral removal of the materials of the lower source-level semiconductor layer 112 and the upper source-level semiconductor layer 116. Remaining portions of the in-process doped source contact layer 114' constitute a doped source contact layer 114. In one embodiment, sidewalls of the doped source contact layer 114 can be laterally recessed away from a most proximal backside trench 79 with respect to a sidewall of a source-level dielectric core 22 embedded within the doped source contact layer 114. Thus, the sacrificial semiconductor layer 104 is replaced with a doped source contact layer 114, which is formed directly on an outer sidewall of each of the vertical semiconductor channels 60.

Figure 21:
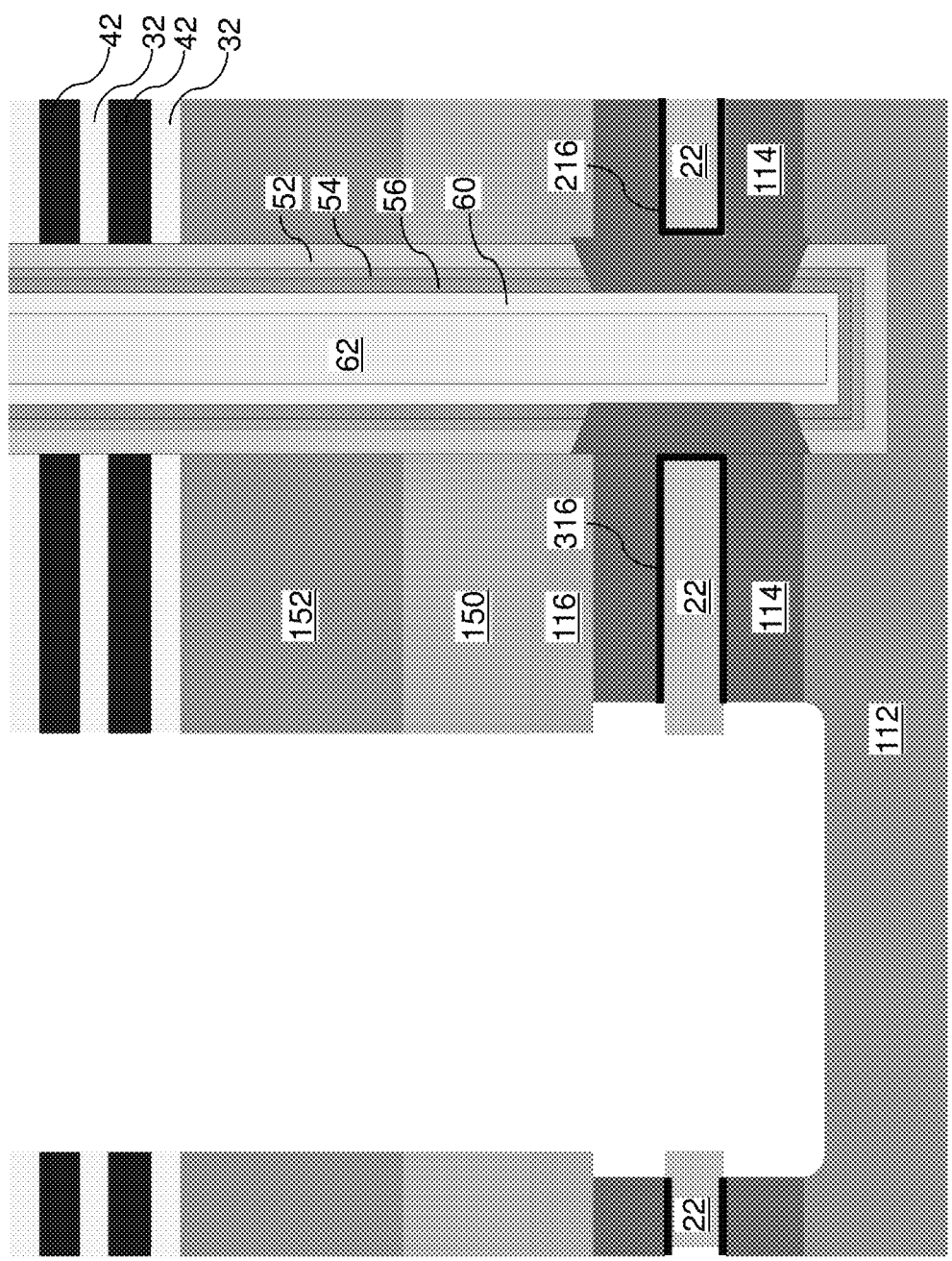
FIG. 21 is a vertical cross-sectional view of the second exemplary structure after removal of the trench spacer according to the second embodiment of the present disclosure.

Referring to FIG. 21, the trench spacers 174 can be removed selective to the dielectric material of the insulating layers 32 and the semiconductor material of the lower source-level semiconductor layer 112. An isotropic etch process that removes the material of the trench spacers 174 selective to the materials of the insulating layers 32 and the doped semiconductor material (such as doped polysilicon) of the lower source-level semiconductor layer 112 and the upper source-level semiconductor layer 116 can be employed. For example, if the trench spacers 174 includes silicon nitride, silicon oxide, a dielectric metal oxide, or a metallic nitride material, a chemical dry etch (CDE) process or a wet etch process can be employed to remove the trench spacers 174. The duration of the wet etch process can be controlled to minimize collateral etching of the insulating layers 32.

Figure 22:
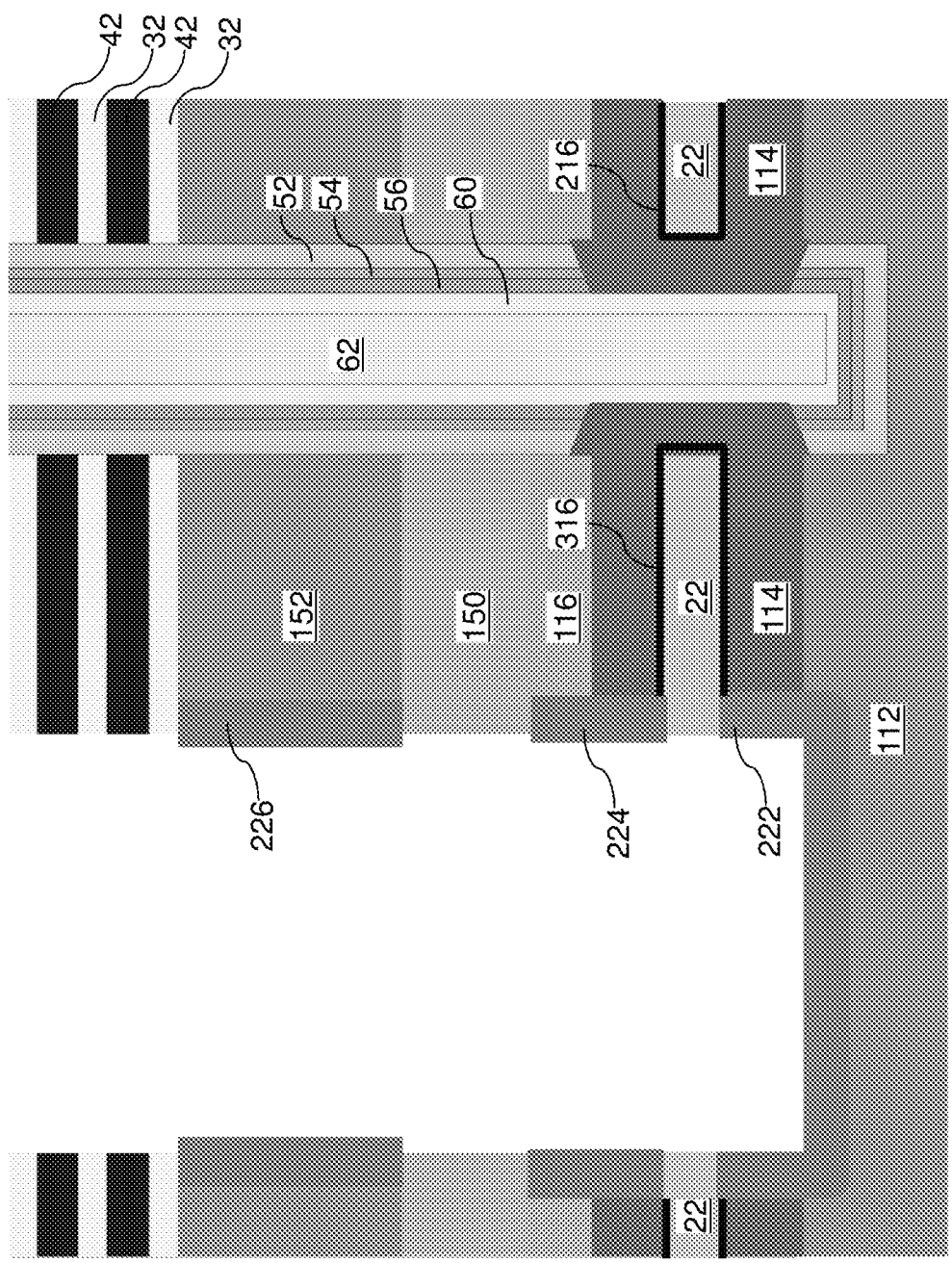
FIG. 22 is a vertical cross-sectional view of the second exemplary structure after formation of various semiconductor oxide spacers according to the second embodiment of the present disclosure.

Referring to FIG. 22, an oxidation process can be performed to convert physically exposed surface portions of the semiconductor materials of the lower source-level semiconductor layer 112, the doped source contact layer 114, the upper source-level semiconductor layer 116, and the source-select-gate semiconductor layer 152 into semiconductor oxide (e.g., silicon oxide) portions (222, 224, 226). A thermal oxidation process or a plasma oxidation process may be employed. A lower source-level semiconductor oxide spacer 222 including an oxide of the first doped semiconductor material and an oxide of the third doped semiconductor material can be formed from each physically exposed surface of the lower source-level semiconductor layer 112 and adjoining lower sidewalls of the doped source contact layer 114 that underlie the source-level dielectric cores 22. An upper source-level semiconductor oxide spacer 224 can be formed from each physically exposed sidewall of the upper source-level semiconductor layer 116 and an adjoining upper sidewall of the doped source contact layer 114. A source-select-gate semiconductor oxide spacer 226 can be formed from each physically exposed sidewall of the source-select-gate semiconductor layer 152. Each lower source-level semiconductor oxide spacer 222 can comprise an oxidized surface portion of the lower source-level semiconductor layer 112 and an oxidized surface portion of the doped source contact layer 114. Each upper source-level semiconductor oxide spacer 224 can comprise an oxidized surface portion of the upper source-level semiconductor layer 116 and an oxidized surface portion of the doped source contact layer 114. Each source-select-gate semiconductor oxide spacer 226 can comprise an oxidized surface portion of the source-select-gate semiconductor layer 152. The lower source-level semiconductor oxide spacers 222, the upper source-level semiconductor oxide spacers 224, and the source-select-gate semiconductor oxide spacers 226 can have a thickness in a range from 3 nm to 20 nm, such as from 6 nm to 10 nm, although lesser and greater thicknesses can also be employed.

Figure 23:
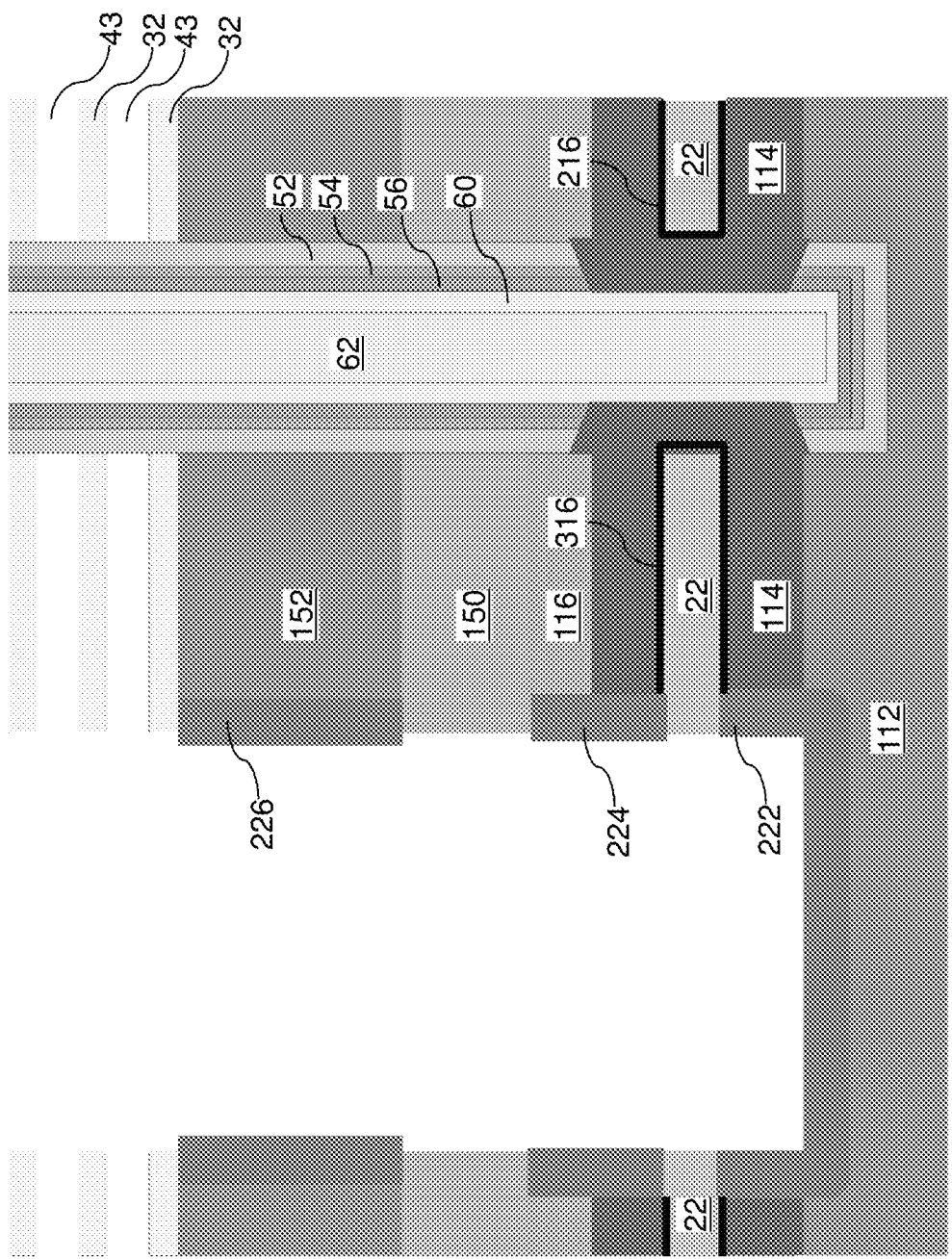
FIG. 23 is a vertical cross-sectional view of the second exemplary structure after formation of backside recesses according to the second embodiment of the present disclosure.

Referring to FIG. 23, the processing steps of FIGS. 15A and 15B can be performed to form backside recesses 43.

Figure 24:
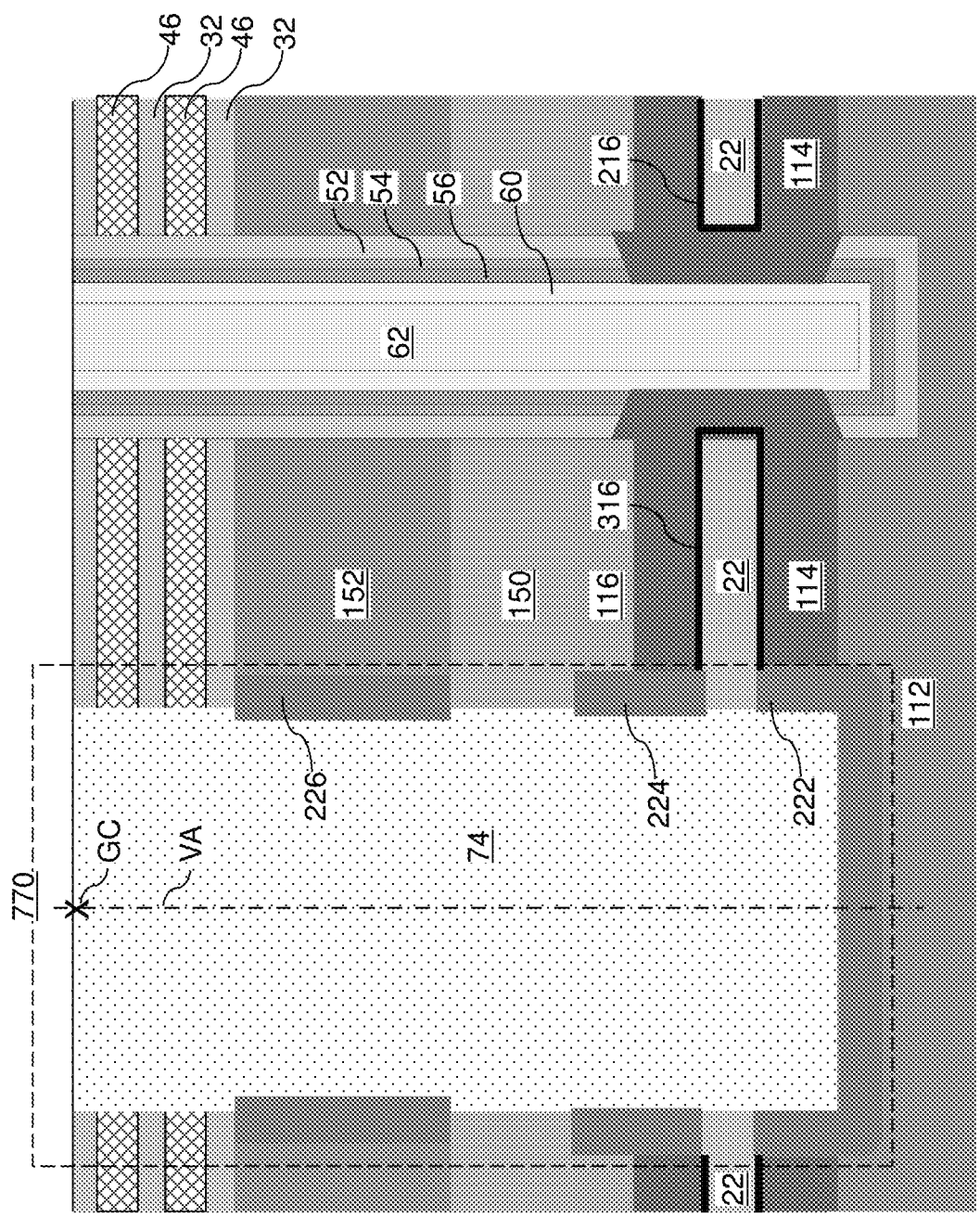
FIG. 24 is a vertical cross-sectional view of the second exemplary structure after formation of electrically conductive layers and a dielectric wall structure according to the second embodiment of the present disclosure.

Referring to FIG. 24, the processing steps of FIGS. 16A and 16B can be performed to form electrically conductive layers 46 and the dielectric wall structure 74. Each dielectric wall structure 74 can be formed directly on a source-level dielectric core 22, a lower source-level semiconductor oxide spacer 222, an upper source-level semiconductor oxide spacer 224, a source-select-gate semiconductor oxide spacer 226, and a source-level dielectric layer 150.

A backside trench fill assembly 770 fills each backside trench 79. Each backside trench fill assembly 770 comprises a dielectric wall structure 74, a source-select-gate semiconductor oxide spacer 226, an upper source-level semiconductor oxide spacer 224, and a lower source-level semiconductor oxide spacer 222. A geometrical center GC of the dielectric wall structure 74 and a vertical axis VA that passes through the geometrical center GC of the dielectric wall structure 74 are illustrated in FIG. 24.

Figure 25B:
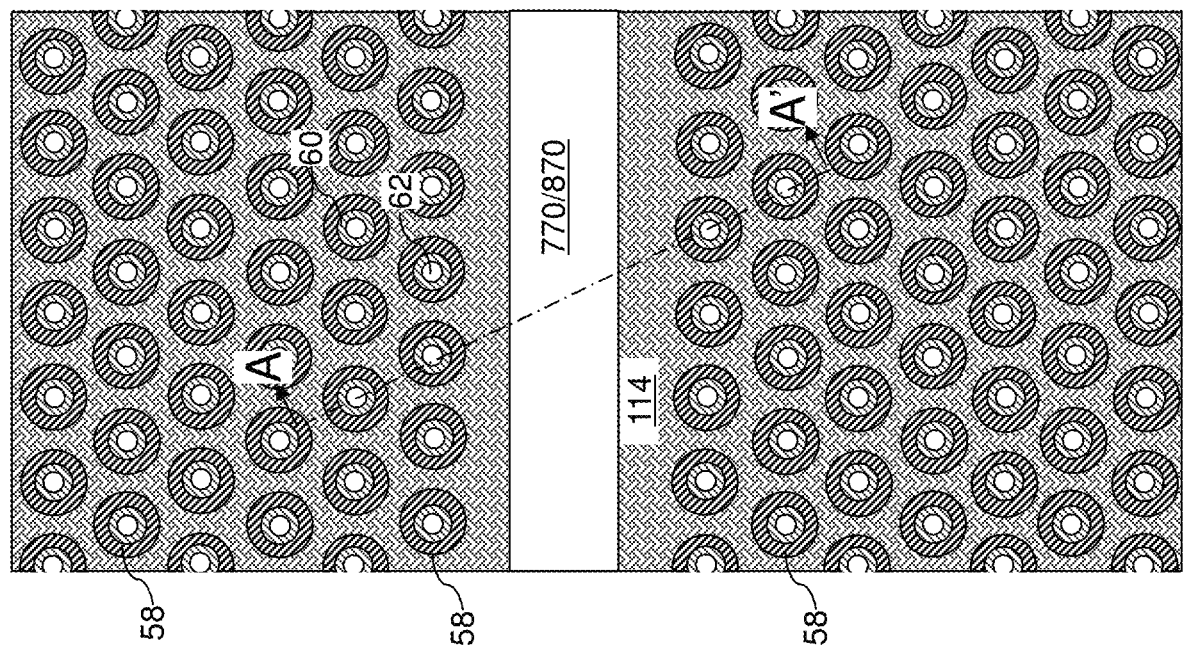
FIG. 25B is a horizontal cross-sectional view of the first or second exemplary structure along the horizontal plane B-B' of the FIG. 25A. The vertical cross-sectional plane A A' is the vertical cross-sectional plane of FIG. 25A.

FIGS. 25A and 25B illustrate the first or second exemplary structure after the processing steps of FIG. 16A, 16B, or 24. The backside trench fill assembly 770/870 is only schematically illustrated, of which the components are illustrated in detail in FIG. 16A, 16B, or 24. Further, the silicon nitride liner 316 and the source-level dielectric cores 22 of the second embodiment are not illustrated in FIGS. 25A and 25B for clarity. The set of material layers including the lower source-level semiconductor layer 112, the doped source contact layer 114, the upper source-level semiconductor layer 116, the optional source-level dielectric layer 150, and the optional source-select-gate semiconductor layer 152 is collectively referred to as source-level material layers 10.

Figure 26A:
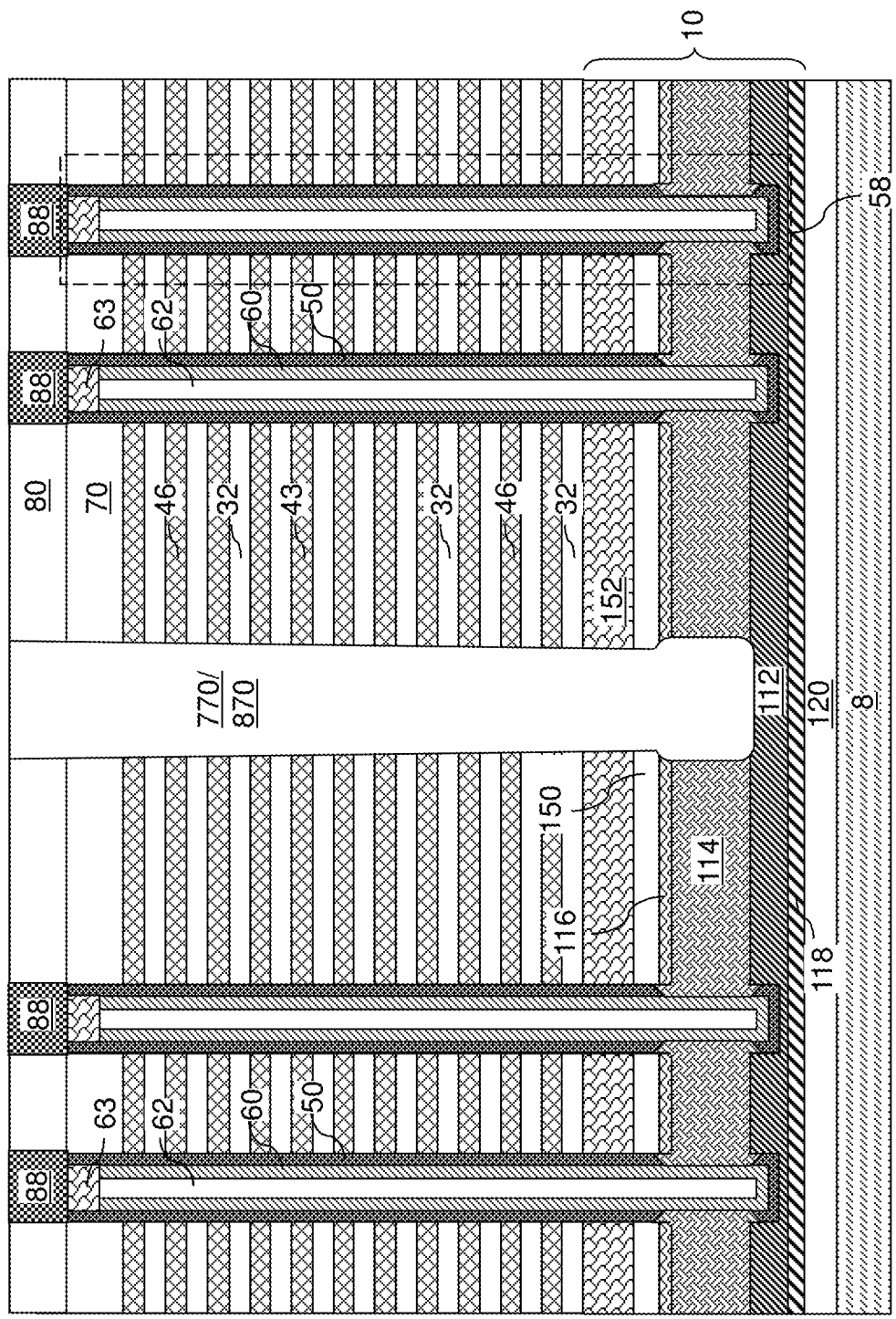
FIG. 26A is a vertical cross-sectional view of the first or second exemplary structure after formation of contact via structures according to embodiments of the present disclosure.
Figure 26C:
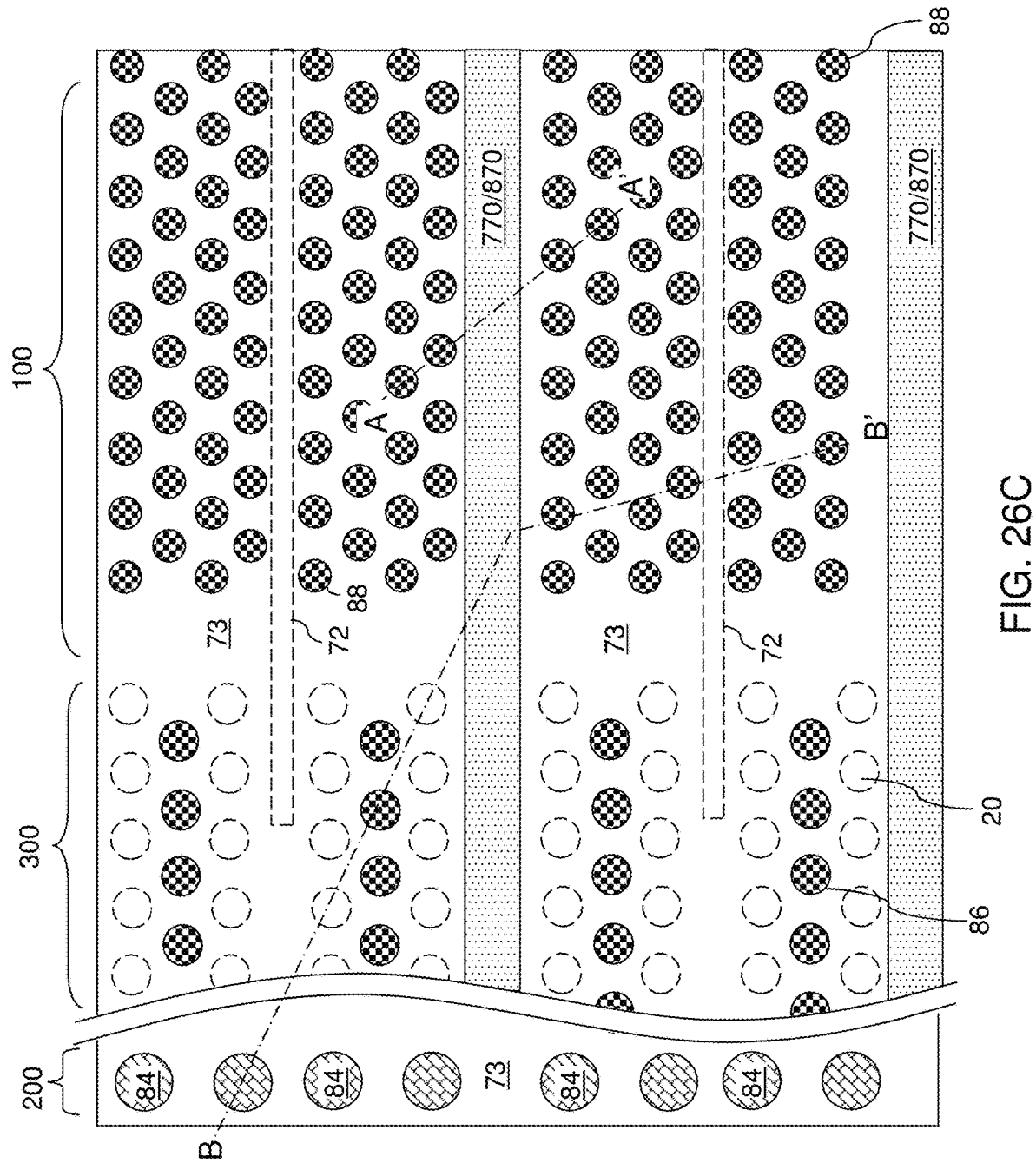
FIG. 26C is a top-down view of the first or second exemplary structure of FIGS. 26A and 26B. The vertical cross-sectional plane A-A' is the vertical cross-sectional plane of FIG. 26A. The vertical cross-sectional plane B-B' is the vertical cross-sectional plane of FIG. 26B.

Referring to FIGS. 26A-26C, contact via structures (88, 86, 84) can be formed through the contact level dielectric layer 80, and through the retro-stepped dielectric material portions 65. For example, drain contact via structures 88 can be formed through the contact level dielectric layer 80 on each drain region 63. Word line contact via structures 86 can be formed on the electrically conductive layers 46 through the contact level dielectric layer 80, and through the retro-stepped dielectric material portions 65. Additionally, peripheral device contact via structures 84 can be formed through the retro-stepped dielectric material portions 65 on respective nodes of the peripheral devices directly and/or through the various lower level metal interconnect structures within the at least one lower level dielectric layer 120. Support pillar structures 20 can be interspersed among the word line contact via structures 86, as shown in FIG. 26B.

Referring to all drawings and according to various embodiments of the present disclosure, a three-dimensional memory device is provided, which comprises: source-level material layers 10 located over a substrate 8 and including a lower source-level semiconductor layer 112 comprising a first semiconductor material, an upper source-level semiconductor layer 116 comprising a second semiconductor material, and a doped source contact layer 114 comprising a third doped semiconductor material and contacting the lower source-level semiconductor layer 112 and the upper source-level semiconductor layer 116; an alternating stack (32, 46) of electrically conductive layers 46 and insulating layers 32 located over the source-level material layers 10; an array of memory stack structures 58 that extend through the alternating stack (32, 46) and at least down to the doped source contact layer 114, each memory stack structure 58 including a vertical semiconductor channel 60 and a memory film 50 laterally surrounding the vertical semiconductor channel 60, wherein the doped source contact layer 114 contacts an outer sidewall of each of the vertical semiconductor channels 60; a dielectric wall structure 74 vertically extending through each layer within the alternating stack (32, 46) and extending below an interface between the doped source contact layer 114 and the upper source-level semiconductor layer 116; and a silicon nitride liner 316 located between the doped source contact layer 114 and the dielectric wall structure 74.

In one embodiment, the first, second, and third doped semiconductor material can have a doping of a same conductivity type, and can include electrical dopants at an atomic concentration in a range from $5.0 \times 10^{19}/cm^3$ to $2.0 \times 10^{21}/cm^3$.

In one embodiment, the silicon nitride liner 316 is located entirely between a first horizontal plane including a planar bottom surface of the lower source-level semiconductor layer 112 and a second horizontal plane including a planar top surface of the upper source-level semiconductor layer 116.

In one embodiment, the silicon nitride liner 316 directly contacts a top surface of the lower source level semiconductor layer 112.

In one embodiment, the lower portion of the dielectric wall structure 74 has a variable thickness that decreases with a lateral distance from a vertical axis VA passing through a geometrical center GC of the dielectric wall structure 74, as illustrated in FIGS. 16A and 16B.

In one embodiment, a silicon oxide liner 318 can directly contact the silicon nitride liner 316 and a lower portion of the dielectric wall structure 74. In one embodiment illustrated in FIGS. 16A and 16B, a lower portion of the dielectric wall structure 74 comprises: an upper tapered surface contacting an upper portion of the silicon oxide liner 318; and a lower tapered surface contacting a lower portion of the silicon oxide liner 318.

In one embodiment, the silicon nitride layer 316 is located entirely between a horizontal plane including a top surface of the doped source contact layer 114 and a horizontal plane including a bottom surface of the doped source contact layer 114, as illustrated in FIG. 24.

In one embodiment, a source-level dielectric core 22 can contact the silicon nitride liner 316 and the dielectric wall structure 74, as illustrated in FIG. 24. In one embodiment, the silicon nitride layer 316 comprises: an upper silicon nitride portion contacting a top surface of the source-level dielectric core 22; a lower silicon nitride portion contacting a bottom surface of the source-level dielectric core 22; and a vertical silicon nitride portion adjoining the upper silicon nitride portion and the lower silicon nitride portion and contacting a sidewall of the source-level dielectric core 22. In one embodiment, the silicon nitride liner 316 is laterally spaced from the dielectric wall structure 74; and the source-level dielectric core 22 contacts the dielectric wall structure 74, as illustrated in FIG. 24

In one embodiment, the source-level material layers 10 further comprise a source-level dielectric layer 150 overlying the upper source-level semiconductor layer 116 and contacting the dielectric wall structure 74; and a source-select-level semiconductor layer 152 overlying the source-level dielectric layer 150. A source-select-level semiconductor oxide spacer 226 comprising an oxide of a semiconductor material of the source-select-level semiconductor layer 152 is located between the source-select-level semiconductor layer 152 and the dielectric wall structure 74.

In one embodiment, an upper source-level semiconductor oxide spacer 224 comprising an oxide of the second semiconductor material of the upper source-level semiconductor layer 116 can contact the upper source-level semiconductor layer 116 and the dielectric wall structure 74.

The combination of the lower source-level semiconductor layer 112, the doped source contact layer 114, and the upper source-level semiconductor layer 116 functions as a direct source strap contact to the vertical semiconductor channels 60. In other words, the combination of the lower source-level semiconductor layer 112, the doped source contact layer 114, and the upper source-level semiconductor layer 116 functions as a source region that directly contacts the vertical semiconductor channels 60.

The silicon nitride liner 316 of an embodiment of the present disclosure can function as a diffusion barrier that suppresses migration of the third semiconductor material of the doped source contact layer 114. The in-process doped source-contact layer 114' can be formed as an amorphous semiconductor material layer (e.g., amorphous silicon) to provide high conformity. Silicon atoms can migrate to form voids during an anneal process that converts the amorphous third doped semiconductor material of the doped-source contact layer 114 into a polycrystalline doped semiconductor material (e.g., polysilicon). The silicon nitride liner 316 can function as a diffusion barrier layer that reduces or prevents movement of the semiconductor atoms therethrough, and thus, reduces or prevents formation of voids in the doped source contact layer 114. The source-level dielectric cores 22 or the dielectric wall structure 74 provide structural support to the silicon nitride liner 316, thereby reducing or preventing deformation of the silicon nitride liner 316 during subsequent anneal processes. The silicon nitride liner 316 of an embodiment of the present disclosure can also decrease oxidation (i.e., prevent excessive oxidation) of the source-level material layers 10 during the oxidation step shown in FIGS. 14A, 14B and which can reduce cell current deterioration due to thinning of the semiconductor layers after excessive oxidation or avoid an open circuit when the entire thickness of the semiconductor layers is converted to an oxide. In other words, the desired thickness of the semiconductor layers (112, 114, 116) is maintained during oxidation.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional memory device comprising:
    source-level material layers located over a substrate and including a lower source-level semiconductor layer comprising a first semiconductor material, an upper source-level semiconductor layer comprising a second semiconductor material, and a doped source contact layer comprising a third doped semiconductor material and contacting the lower source-level semiconductor layer and the upper source-level semiconductor layer;
    an alternating stack of electrically conductive layers and insulating layers located over the source-level material layers;
    an array of memory stack structures that extend through the alternating stack and at least down to the doped source contact layer, each memory stack structure including a vertical semiconductor channel and a memory film laterally surrounding the vertical semiconductor channel, wherein the doped source contact layer contacts an outer sidewall of each of the vertical semiconductor channels;
    a dielectric wall structure vertically extending through each layer within the alternating stack and extending below an interface between the doped source contact layer and the upper source-level semiconductor layer; and
    a silicon nitride liner located between the doped source contact layer and the dielectric wall structure, wherein the silicon nitride liner is located entirely between a first horizontal plane including a planar bottom surface of the lower source-level semiconductor layer and a second horizontal plane including a planar top surface of the upper source-level semiconductor layer.

2. The three-dimensional memory device of claim 1, wherein the silicon nitride liner directly contacts a top surface of the lower source level semiconductor layer.

3. The three-dimensional memory device of claim 1, wherein the lower portion of the dielectric wall structure has a variable thickness that decreases with a lateral distance from a vertical axis passing through a geometrical center of the dielectric wall structure.

4. The three-dimensional memory device of claim 3, further comprising a silicon oxide liner located between the silicon nitride liner and the dielectric wall structure.

5. The three-dimensional memory device of claim 4, wherein a lower portion of the dielectric wall structure comprises:
    an upper tapered surface underlying an upper portion of the silicon oxide liner; and
    a lower tapered surface overlying a lower portion of the silicon oxide liner.

6. The three-dimensional memory device of claim 1, wherein the silicon nitride layer is located entirely between a horizontal plane including a top surface of the doped source contact layer and a horizontal plane including a bottom surface of the doped source contact layer.

7. The three-dimensional memory device of claim 1, further comprising a source-level dielectric core contacting the silicon nitride liner and the dielectric wall structure.

8. The three-dimensional memory device of claim 7, wherein the silicon nitride layer comprises:
    an upper silicon nitride portion contacting a top surface of the source-level dielectric core;
    a lower silicon nitride portion contacting a bottom surface of the source-level dielectric core; and
    a vertical silicon nitride portion adjoining the upper silicon nitride portion and the lower silicon nitride portion.

9. The three-dimensional memory device of claim 7, wherein:
    the silicon nitride liner is laterally spaced from the dielectric wall structure; and
    the source-level dielectric core contacts the dielectric wall structure.

10. A three-dimensional memory device of comprising:
    source-level material layers located over a substrate and including a lower source-level semiconductor layer comprising a first semiconductor material, an upper source-level semiconductor layer comprising a second semiconductor material, and a doped source contact layer comprising a third doped semiconductor material and contacting the lower source-level semiconductor layer and the upper source-level semiconductor layer;
    an alternating stack of electrically conductive layers and insulating layers located over the source-level material layers;
    an array of memory stack structures that extend through the alternating stack and at least down to the doped source contact layer, each memory stack structure including a vertical semiconductor channel and a memory film laterally surrounding the vertical semiconductor channel, wherein the doped source contact layer contacts an outer sidewall of each of the vertical semiconductor channels;
    a dielectric wall structure vertically extending through each layer within the alternating stack and extending below an interface between the doped source contact layer and the upper source-level semiconductor layer; and
    a silicon nitride liner located between the doped source contact layer and the dielectric wall structure;
wherein:
    the source-level material layers further comprise a source-level dielectric layer overlying the upper source-level semiconductor layer and contacting the dielectric wall structure, and a source-select-gate semiconductor layer overlying the source-level dielectric layer; and
    a source-select-gate semiconductor oxide spacer comprising an oxide of a semiconductor material of the source-select-gate semiconductor layer is located between the source-select-gate semiconductor layer and the dielectric wall structure.

11. The three-dimensional memory device of claim 10, further comprising an upper source-level semiconductor oxide spacer comprising an oxide of the second semiconductor material of the upper source-level semiconductor layer and contacting the upper source-level semiconductor layer and the dielectric wall structure.

* * * * *